(12) United States Patent
Webster et al.

(10) Patent No.: US 9,178,100 B2
(45) Date of Patent: Nov. 3, 2015

(54) SINGLE PHOTON AVALANCHE DIODE FOR CMOS CIRCUITS

(75) Inventors: Eric Alexander Garner Webster, Glasgow (GB); Robert Kerr Henderson, Edinburgh (GB)

(73) Assignees: STMicroelectronics (Research & Development) Limited, Marlow, Buckinghamshire (GB); The University Court of the University of Edinburgh, Edinburgh (GB)

( * ) Notice: Subject to any disclaimer, the term of this patent is extended or adjusted under 35 U.S.C. 154(b) by 0 days.

(21) Appl. No.: 13/821,524

(22) PCT Filed: Sep. 8, 2011

(86) PCT No.: PCT/GB2011/051686
§ 371 (c)(1),
(2), (4) Date: Apr. 5, 2013

(87) PCT Pub. No.: WO2012/032353
PCT Pub. Date: Mar. 15, 2012

(65) Prior Publication Data
US 2013/0193546 A1    Aug. 1, 2013

(30) Foreign Application Priority Data
Sep. 8, 2010    (GB) .................................. 1014843.5

(51) Int. Cl.
*H01L 31/107* (2006.01)
*H01L 27/144* (2006.01)
(Continued)

(52) U.S. Cl.
CPC .......... *H01L 31/107* (2013.01); *H01L 27/1443* (2013.01); *H01L 31/02327* (2013.01);
(Continued)

(58) Field of Classification Search
USPC ............................................. 257/438; 438/92
See application file for complete search history.

(56) References Cited

U.S. PATENT DOCUMENTS

| 8,253,215 B2 * | 8/2012 | Yao ................................ 257/461 |
| 2004/0097021 A1 | 5/2004 | Augusto et al. |

(Continued)

FOREIGN PATENT DOCUMENTS

| EP | 2144303 A1 * | 1/2010 |
| EP | 2144303 A1 | 1/2010 |

(Continued)

OTHER PUBLICATIONS

Karami et al: "A New Single-Photon Avalanche Diode in 90nm Standard CMOS Technology," Proceedings of SPIE, vol. 7780, Aug. 4, 2010, pp. 77801 F-77801 F-6 (6 pages).*

(Continued)

*Primary Examiner* — Matthew Reames
*Assistant Examiner* — Vincent Wall
(74) *Attorney, Agent, or Firm* — Gardere Wynne Sewell LLP

(57) ABSTRACT

A single photon avalanche diode for use in a CMOS integrated circuit includes a deep n-well region formed above a p-type substrate and an n-well region formed above and in contact with the deep n-well region. A cathode contact is connected to the n-well region via a heavily doped n-type implant. A lightly doped region forms a guard ring around the n-well and deep n-well regions. A p-well region is adjacent to the lightly doped region. An anode contact is connected to the p-well region via a heavily doped p-type implant. The junction between the bottom of the deep n-well region and the substrate forms a multiplication region when an appropriate bias voltage is applied between the anode and cathode and the guard ring breakdown voltage is controlled with appropriate control of the lateral doping concentration gradient such that the breakdown voltage is higher than that of the multiplication region.

32 Claims, 14 Drawing Sheets

(51) Int. Cl.
 *H01L 31/0232* (2014.01)
 *H01L 31/0236* (2006.01)
 *H01L 31/18* (2006.01)
(52) U.S. Cl.
 CPC .......... *H01L31/02363* (2013.01); *H01L 31/18* (2013.01); *H01L 31/1804* (2013.01); *Y02E 10/547* (2013.01)

(56) References Cited

U.S. PATENT DOCUMENTS

| | | | |
|---|---|---|---|
| 2006/0192086 A1* | 8/2006 | Niclass et al. | 250/214.1 |
| 2010/0013458 A1 | 1/2010 | Lany et al. | |
| 2010/0019295 A1 | 1/2010 | Henderson et al. | |
| 2010/0133636 A1 | 6/2010 | Richardson et al. | |
| 2010/0314531 A1* | 12/2010 | Menge | 250/214.1 |

FOREIGN PATENT DOCUMENTS

| | | | |
|---|---|---|---|
| WO | WO-2008011617 A2 | | 1/2008 |
| WO | WO 2008011617 A2 * | | 1/2008 |
| WO | WO-2008113067 A2 | | 9/2008 |
| WO | WO-2009103048 A1 | | 8/2009 |

OTHER PUBLICATIONS

M. Gersbach, J. Richardson, E. Mazaleyrat, S. Hardillier, C. Niclass, R. Henderson, L. Grant & E. Charbon, "A low-noise single-photon detector implemented in a 130 nm CMOS imaging process," Solid-State Electronics, vol. 53, Issue 7, 2009.*

Karmani, et al., "A New Single-Photon Avalanche Diode in 90nm Standard CMOS Technology," Proceedings of SPIE, vol. 7780, Aug. 4, 2010, pp. 77801F-77801F.*

S. Wolf and R.N. Tauber, "Silicon Processing for the VLSI Era: vol. 1—Process Technology", 2000, Lattice Press, 2nd ed., p. 423-424.*

International Search Report for PCT/GB2011/051686 mailed Nov. 8, 2012 (7 pages).

Karami et al: "A New Single-Photon Avalanche Diode in 90nm Standard CMOS Technology," Proceedings of SPIE, vol. 7780, Aug. 4, 2010, pp. 77801F-77801F-6 (6 pages).

Webster, et al.: "An Infra-Red Sensitive, Low Noise, Single-Photon Avalanche Diode in 90 nm CMOS," 2011 International Image Sensor Workshop (IISW), Hokkaido, Japan, Jun. 8, 2011 (4 pages).

R. H. Haitz, A. Goetzberger, R. M. Scarlett, W. Shockley, "Avalanche Effects in Silicon p-n Junctions. I. Localised Photomultiplication Studies on Microplasmas," Journal of Applied Physics, vol. 34, No. 6, 1963, pp. 1581-1590.

A. Goetzberger, B. McDonald, R. H. Haitz, R. M. Scarlett, "Avalanche Effects in Silicon p-n Junctions. II. Structurally Perfect Junctions," Journal of Applied Physics, vol. 34, No. 6, 1963, pp. 1591-1600.

R. H. Haitz, "Mechanisms Contributing to the Noise Pulse Rate of Avalanche Diodes," Journal of Applied Physics, vol. 36, No. 10, 1965, pp. 3123-3131.

K. G. McKay, "A. Germanium Counter," Phys. Rev., vol. 76, Issue 10, pp. 1537.

R. H. Haitz, "Model for the electrical behavior of a microplasma," Journal of Applied Physics, vol. 35, No. 5, 1964, pp. 1370-1376.

S. M. Sze: "Physics of Semiconductor Devices," Second Edition, John Wiley & Sons, 1981, ISBN: 0-471-09837-X, p. 772.

S. Cova, M. Ghioni, A. Lotito, F. Zappa, "Evolution and Prospect of Single-Photon Avalanche Diodes and Quenching Circuits," Workshop on Single Photon Detectors, NIST, Gaithersburg, 2003.

S. Cova, A. Longoni, & A. Andreoni, "Towards picosecond resolution with single-photon avalanche diodes," Review of Scientific Instruments, vol. 52, No. 3, 1981.

R. J. McIntyre, "Recent developments in silicon avalanche photodiodes," Measurement, vol. 3, Issue 4, 1985, pp. 146-152.

A. Rochas, M. Gani, B. Furrer, P. A. Besse, and R. S. Popovic, "Single photon detector fabricated in a complementary metal-oxide-semiconductor high-voltage technology," Review of Scientific Instruments, vol. 74, No. 7, 2003.

J.A. Richardson, L.A. Grant, R.K. Henderson, "A Low Dark Count Single Photon Avalanche Diode Structure Compatible with Standard Nanometer Scale CMOS Technology," IEEE Photonics Technology Letters, vol. 21, Issue 14, 2009, pp. 1020-1022.

M. J. Hsu, H. Finkelstein, & S. C. Esener, "A CMOS STI-Bound Single-Photon Avalanche Diode With 27-ps Timing Resolution and a Reduced Diffusion Tail," IEEE Electron Device Letters, vol. 30, No. 6, 2009.

J. Richardson, E. A. G. Webster, L. Grant, R. Henderson, "A 2um Diameter, 9Hz Dark Count, Single Photon Avalanche Diode in 130nm CMOS Technology", ESSDERC 2010, to be published.

E. S. Yang: "Microelectronic Devices," McGraw-Hill, 1988, ISBN: 0-07-072238-2, pp. 63-66.

<http://image-sensors-world.blogspot.com/2010/02/cmos-imaqe-sensors-technologies-markets.html>.

<http://www.i-micronews.com/reports/CMOS-Image-Sensors-Technologies-Markets-2010-Report/126/>.

Ciftcioglu et al. Journal of Lightwave Technology, vol. 27, Issue 15, 2009, pp. 3303-3313, 2009 (referenced in introduction of application and mentioned by Eric in email of Jul. 12, 2010) http://www.opticsinfobase.org/abstract.cfm?URI=JLT-27-15-3303.

Berkehan Ciftcioglu, et al: "Integrated Silicon PIN Photodiodes Using Deep N-Well in a Standard 0.18 um CMOS Technology," Journal of Lightwave Technology, vol. 27, No. 15, Aug. 1, 2009.

Finkelstein et al Electronic letters vol. 43. No. 22, Oct. 25, 2007.

Chew at al ESSDERC 2002 pp. 251-254 "Impact of Deep N-Well Implementation on Substrate Noise Coupling and RF Transistor Performance for Systems on a chip Integration," Impact of Deep N-well Implantation on Substrate Noise Coupling and RF.

* cited by examiner

SINGLE PHOTON AVALANCHE DIODE FOR CMOS CIRCUITS

PRIORITY CLAIM

This application is a 371 filing of PCT/GB2011/051686 filed Sep. 8, 2011, which claims priority from Great Britain Application for Patent 1014843.5 filed Sep. 8, 2010, the disclosures of which are incorporated by reference.

FIELD OF THE INVENTION

The present invention relates to a single photon avalanche diode (SPAD) and a method of fabricating same, and relates in particular to SPADs manufactured in a CMOS fabrication process.

BACKGROUND TO THE INVENTION

Photodiodes convert light into electrical signals, and form the basis of a wide range of imaging and detection devices. Common configurations of photodiodes include PIN photodiodes, operated in photovoltaic or photoconductive mode, and single photon avalanche diodes (SPADs), typically operated in Geiger mode. Photodiodes can be realised using a number of different technologies, but it is particularly convenient and economical to form photodiodes using the CMOS fabrication process that has evolved as the production method of choice for integrated circuits of almost all types.

Some examples of a PIN photodiode formed in a CMOS fabrication process are given in Ciftcioglu et al, "Integrated Silicon PIN Photodiodes Using Deep N-Well in a Standard 0.18-μm CMOS Technology," Journal of Lightwave Technology, Vol. 27, No. 15, 1 Aug. 2009.

FIG. 1 is a schematic of a known lateral PIN photodiode, corresponding to the device shown in FIG. 1(c) of the Ciftcioglu et al document. During an epi-CMOS fabrication process, a lightly doped p-type epi-layer 102 is grown on a more heavily doped P-type substrate 100. Two n-wells (containing n-type doping) 104, 106 are formed in the epi-layer 102, and cathodes 108, 110 and an anode 112 are deposited on the surface, with highly doped n-type and p-type regions beneath the contacts. During operation, photons striking the region between the n-wells 104, 106 and the anode create charge carriers, either causing current to flow or voltage to build up between the contacts depending on the mode of operation.

(Within this document, terms such as 'above', 'on', 'below', 'top', 'bottom', 'horizontally' and 'vertically' should be construed with reference to the integrated circuit cross-sections illustrated in the attached figures. In particular, a horizontal direction runs parallel to the substrate, and a vertical direction runs perpendicularly in and out of the substrate, with 'down' running deeper into the substrate, and 'up' leading to the surface, or 'top' of the device. Accordingly, epitaxial growth and component formation during the fabrication process will proceeds in an 'upwards' direction to the 'top' of the device.)

FIG. 2 is a schematic of another known lateral PIN photodiode, corresponding to the device shown in FIG. 1(d) of the Ciftcioglu et al document. Again a lightly doped p-type epi-layer 202 overlies a more heavily doped p-substrate 200. In this device, a 'deep n-well' 204 is formed in the epi-layer 202. A p-well 206 is formed above the deep n-well 204 and the n-wells 208, 210 and cathodes 212, 214 and anode 216 are formed as before.

The deep n-well feature is a standard part of the CMOS fabrication toolkit available to circuit designers, and is conventionally used to allow transistor isolation to be improved and to reduce substrate noise coupling in mixed-signal and RF circuits. Deep n-wells are formed using ion implantation to form an n-type region deep in the substrate or epi-layer. The deepest part of a deep n-well may for example be in the region of 2 μm below the surface of the wafer. In the device of FIG. 2, the deep n-well allows for a reduction in size of the depletion region at the top of the deep n-well, allowing increased bandwidth with a reduction in bias voltage.

Considering now a single photon avalanche diode, SPAD (which is operated in a different mode to PIN photodiodes), one requirement for a SPAD to effectively operate above breakdown is that there should be no high field localisation around the edge of the detector active area. This criterion can be met by using a 'guard ring', which can be fabricated by a variety of methods. A common feature of such methods is a structure that successfully raises the breakdown voltage of the periphery of the active region of the detector above the breakdown voltage of the planar, or light sensitive, region.

FIG. 3 is a schematic of a known SPAD, described for example in Rochas et al, "Single photon detector fabricated in a complementary metal-oxide-semiconductor high-voltage technology," Review of Scientific Instruments, Vol. 74, No. 7, 2003. In FIG. 3, a deep n-well 302 is formed in a substrate 300, and heavily doped n-type and p-type doped regions are created to form a dual p+/deep n-well/p-substrate junction. A p-well guard ring 304 is also formed, and a metal ring 306 is located above the p+ anode with a central gap of approximately 7 μm. The upper p+/deep n-well junction provides the multiplication region where Geiger breakdown occurs. However, one problem with the device shown in FIG. 3 is that very high doping concentrations on both sides of the active junction lead to a high electric field, which results in excessive noise due to band-to-band tunnelling.

Other guard ring constructions have been demonstrated to work with SPADs, such as Shallow Trench Isolation (STI). On example of a STI guard ring is given in WO 2008/011617, for example. STI works as a guard ring because its permittivity is lower than silicon, allowing it to dissipate high electric fields successfully. However, traps at the STI/silicon interface mean that such devices have high parasitic count rates.

A problem suffered by known CMOS SPADs is that their peak detection efficiency is at blue light wavelengths, because the active region of the devices is relatively shallow (with respect to the surface). Electromagnetic energy has different characteristic absorption depths in silicon depending on its wavelength. High frequency, high energy, short wavelength blue light is absorbed close to the surface, while long wavelength red and near infra-red (NIR) is absorbed deeper. Statistically it is more probable that a red photon will generate an electron deeper in the silicon than a blue photon.

Red and NIR response is a particularly important feature for SPADs because of two main application areas: range detection and lifetime analysis. NIR frequencies of 850 nm and 940 nm are commonly used in ranging systems because many LEDs are available at 850 nm, and 940 nm corresponds to a window in solar output leading to increased signal-to-noise ratio operating outdoors. Moreover, SPADs have been used in biological experiments for lifetime estimation. Since blue corresponds to high energy photons, it has the disadvantage of phototoxicity for the cells which are to be observed. Moreover, near-infra red will penetrate further into tissue with potential applications in diffuse optical tomography (DOT). A third important application is the use of SPADs in communications where near-infra red is commonly employed because it is efficiently transmitted within optical fibres.

The present invention seeks to address these and other problems in the prior art.

SUMMARY OF THE INVENTION

In a first aspect of the invention there is provided a single photon avalanche diode, SPAD, for use in a CMOS integrated circuit, the SPAD comprising: a first region comprising a deep well of a first conductivity type (such as a deep n-well), the first region being formed above a second region of a second conductivity type; a first contact (such as a cathode contact) connected to the first region via a conductive pathway of the first conductivity type; and a second contact (such as an anode contact) connected to the second region via a conductive pathway of the second conductivity type; the doping in the vicinity of the first region being controlled such that the breakdown voltage is smaller at the junction between the bottom of the deep well and the second region than elsewhere around the first region, whereby the junction forms a SPAD multiplication region when an appropriate bias voltage is applied between the contacts.

The term 'conductive pathway' as used herein preferably connotes a pathway through a doped (and normally undepleted) semiconductor material, but may also refer to an ohmic conductor arrangement at least in part. The term 'in the vicinity of a region' as used herein preferably connotes either within or adjacent to the region, and may for example connote at a boundary area associated with the region. It will be appreciated that due to diffusion and implantation effects the boundary between the region and elsewhere may not be clearly demarcated (so that 'in the vicinity of' may for example comprise an area within 0.01, 0.1, 0.5, 1 μm, 10 μm or 50 μm, say, from a part of the region having a substantially uniformly doping gradient in at least one direction). The deep well region may be formed by ion implantation or any other appropriate process.

The use of a deep well (such as a deep n-well) to form the SPAD multiplication junction can reduce the cost and complexity of fabrication, because (as noted above) the deep well feature is a standard part of the CMOS fabrication toolkit. In addition the SPAD can have much better long wavelength detection properties due to the relatively deep location of the SPAD multiplication junction at the bottom of the deep well. Red sensitivity improvements can allow the use of the SPAD in digital communication systems using optical fibres, for example, because the attenuation of red light is less than blue light. The use of red light can also allow the SPAD to be used in biological experiments which would otherwise not have been feasible using the higher energy blue light.

The first and second contacts may be arranged on the same surface for compatibility with standard CMOS fabrication processes. The second region is preferably a substrate (such as the standard p-type substrate used in CMOS processing) but can be an epi-layer grown on the substrate, or even another, deeper implant.

In a second aspect of the invention there is provided a single photon avalanche diode, SPAD, for use in a CMOS integrated circuit, the SPAD comprising: a first region of a first conductivity type, arranged on or in a second region comprising an epi-layer or substrate of the circuit, the epi-layer or substrate being of a second conductivity type; a first contact connected to the first region via a conductive pathway of the first conductivity type; and a second contact connected to the second region via a conductive pathway of the second conductivity type; the first and second contacts being arranged on the same surface; and the doping in the vicinity of the first region being controlled such that the breakdown voltage is smaller at the junction between the bottom of the first region and the second region than elsewhere around the first region, whereby the junction forms a SPAD multiplication region when an appropriate bias voltage is applied between the contacts.

The use of the substrate or epi-layer as part of the SPAD circuit can make use of pre-existing doping to simplify the fabrication process.

The SPAD is preferably formed substantially within the epi-layer, although it can alternatively be formed in bulk CMOS (only in the substrate) with appropriate control of doping and implants in order to meet the guard ring requirement of a higher breakdown voltage than the planar multiplication region.

In one embodiment a doping gradient may be applied to the substrate to create a drift field in the substrate. With a p-type substrate, for example, the drift field can enhance photon detection probability by drifting photogenerated electrons up into the substrate into the multiplication region situated in the substrate or epi-layer.

As in the first aspect, the first region may be a deep well, such as a deep n-well feature formed during a standard CMOS fabrication process, or may be a different feature such as a shallower well, for example (for an optical response more similar to known CMOS SPADs), or any other appropriate implant or feature. Non-standard implants may for example be used, but this will have a cost penalty compared to a standard CMOS fabrication process. The first region is preferably not a heavily doped electrode implant. The first region may be below a heavily doped electrode implant.

The following features can generally be applied to either the first or second aspects (and indeed also the third, see below, where appropriate):

The SPAD may further comprise a guard ring region surrounding the first region. The guard ring region surrounds all of the first region, and helps to ensure that the breakdown voltage of any peripheral p-n junctions is above that of the active SPAD multiplication junction at the bottom of the first region. A number of different types of guard ring region with this aim are mentioned below. Shallow trench isolation (STI) using Silicon Dioxide, for example, can also be used but is less preferable because of the likelihood of traps forming at the silicon-oxide interface which result in high noise count rates. The guard ring need not be circular, but it needs to be substantially the same shape as the active region in order to contact it at substantially all points.

The guard ring region may have a doping concentration of the second conductivity type that increases with depth. This is the case for example if the guard ring region is the 'native' epi-layer material without any additional implants; the epi-layer when formed has a doping concentration gradient that increases with depth.

Alternatively, the guard ring region may alternatively have a doping concentration that is substantially uniform at different depths. This may be the case for example when the first region has a doping concentration that increases with depth. A retrograde deep n-well or deep p-well has approximately this characteristic, for example, although implantation ion channelling effects produce a 'tail' on the well concentration which limits the ability to produce a true 'retrograde' well. Accordingly there is a need in this case also to control the substrate profile to ensure that the channelling tail is compensated by the substrate profile to make the planar SPAD junction have the lowest breakdown voltage and not the guard ring.

The doping concentration of the first region is reduced at its horizontal periphery, for example because of dopant diffusion during the high temperatures of the fabrication process. This can also increase the breakdown voltage at the periphery relative to the breakdown voltage at the active multiplication junction.

In one variant the guard ring region has the same conductivity type as the first region and has a relatively smaller doping concentration. In another variant, the guard ring region has a different conductivity type and is lightly doped.

The guard ring may comprise a plurality of said guard ring regions, which may have different structures. Thus, two or more of the above guard ring regions may be combined.

Preferably the junction between the bottom of the deep well and the second region is substantially parallel to the surface of the integrated circuit.

Preferably, the junction between the first region (e.g. the bottom of the deep well) and the second region is at least as deep as (or preferably deeper than) the deepest part of the guard ring. As well as the improved sensitivity to red light arising from the relatively deep junction, the electric field in the SPAD multiplication region curves in a constant sense, enabling the SPAD to have a better fill factor than would otherwise be the case.

In one embodiment the SPAD may further comprise a deep enhancement implant of the second conductivity type, arranged below the first region. This can reduce the breakdown voltage of the active junction relative to the other boundaries of the first region. The enhancement implant may for example an imaging-specific deep p-implant used for reduction of colour crosstalk in CMOS image sensors.

The SPAD may further comprise a highly doped region of the second conductivity type extending between the second contact and the second region. The highly doped region may be adjacent to the second contact, enabling a low resistance contact to be formed, and may extend as far as or into the substrate. The highly doped region may comprise a continuous ring of doped material. Thus a low resistance and uniform path can be provided for an avalanche current to take following a breakdown event. Regarding the contacts, the second contact may be a ring (circular or otherwise), or may be provided as two separate contacts in a linear or other arrangement. The features relating to the contacts should be taken as being modified appropriately for either the ring-like or double contact arrangements. The contact can either be a continuous ring around the active region or can be discontinuous.

The SPAD may further comprise an inner well of the second conductivity type formed within the first region. The term 'inner' preferably connotes only the notion that the well is substantially inside another. This feature reduces the sensitivity to light within the depths covered by the inner well, which can improve the wavelength selectivity of the device. For example, with the well extending substantially from the surface to a certain depth below the surface, the device will be optimised to detect longer wavelengths of light that penetrate deeper into the SPAD. The inner well is preferably surrounded by a further guard ring and the doping is controlled such that the breakdown voltage between the inner well and the deep well is not less than the breakdown voltage at the active multiplication junction. In one embodiment a separate bias voltage can be applied to the inner well further to control the functionality of the SPAD.

The dimensions of the SPAD are determined by practical requirements. The radius of the SPAD is preferably less than 16 μm. The radius may be larger, or substantially smaller, for example less than 30, 20, 16, 14, 12, 10, 8, 5 or 1 μm for example, or less than 100 μm or 200 μm. The furthest extent of the deep well may for example be approximately 4 μm, between 3.5 and 4.5 μm, between 2 and 5 μm, or between 1 and 6 μm from the centre of the SPAD. The guard ring may be approximately 1 μm, between 0.75 and 1.5 μm, between 0.4 and 2 μm, or between 0.1 and 4 μm in width. The farthest part of the SPAD, which may for example be the second contact(s), may be between 5 and 6 μm, between 4 and 7 μm, between 3 and 9 μm, between 1 and 12 μm, or between 0.5 and 15 μm from the centre of the SPAD, for example (or yet nearer or further). The size of the active junction of the SPAD may be less than $10^{-4}$, $10^{-5}$ or $10^{-6}$ cm$^2$ (or larger or smaller), for example. In one embodiment the dimensions of the deep n-well, guard ring and contact region thickness may be 8 μm, 1 μm and 1 μm, for example, or scaled up or down in substantially the same ratio (or in substantially the same ratio as other values, for example as suggested above) to obtain desired characteristics.

The bottom of the first region may be at a depth of more than one of 0.25, 0.5, 1, 2, 3 and 5 μm from the surface of the SPAD. It may more preferably be between 1 and 2.5 μm, between 0.75 and 3, between 0.5 and 3.5 μm, or between 0.25 and 5 μm, for example.

The SPAD may be more sensitive to red and near infra-red light than to blue light, depending for example on whether or not an inner well is provided. The terms 'red light', 'near infra-red light' and 'blue light' preferably connote electromagnetic radiation having a wavelength of approximately 700 nm, 850 nm and 475 nm respectively. The SPAD may be approximately 3 times more sensitive to red light than blue light, and/or approximately 5 times more sensitive to NIR light than blue light, for example, or any other multiples (greater or smaller) as appropriate.

In a related aspect of the invention there may be provided an integrated circuit comprising a SPAD as aforesaid.

In the integrated circuit, one of the contacts may be connected to a common voltage supply on the integrated circuit, which may be ground. This can allow the feature size and complexity of the circuit to be reduced.

The integrated circuit may further comprise at least one MOS transistor, the at least one MOS transistor being electrically isolated from the substrate by a deep well of the first conductivity type (such as a deep n-well). This is an example of how standard CMOS processes can be reused to make the fabrication process more efficient.

The integrated circuit may further comprise a quench circuit, including a quench resistor which may be high voltage compatible bias resistor, for example, for connecting one of the contacts to a positive breakdown voltage supply. The resistor is preferably a highly resistive poly mask, but other 'quench' resistors may be used. In an alternative embodiment the contact may be connected directly to a switchable power supply, or there may otherwise be provided some manner of switching the SPAD on and off into above breakdown condition.

The integrated circuit may also include an AC coupling unit connected to one of the SPAD contacts (the output of the SPAD, which may for example be a cathode). The AC coupling unit preferably comprises a high voltage compatible capacitor (such as metal-oxide-metal (MOM) fringing) and a bias transistor to set a DC bias point at the input of a digital read-out circuit. A CMOS read-out circuit may be connected to the AC coupling unit output. Alternatively the SPAD may be connected directly to a high voltage compatible MOS device, such as a drift MOS.

The integrated circuit may in one embodiment be configured as a back side illumination (BSI) imaging system, in which light strikes the SPAD from the reserve (bottom) side of the substrate. This can provide an enhanced blue response and improved broad spectrum sensitivity. An advantage of BSI, described in more detail below, is that anti-reflective coatings can be used, and the choice of dielectric layers is not constrained by those required for MOSFET and metal interconnect fabrication, as is the case with front-side illumination configurations.

The integrated circuit may include at least one further SPAD (for example to form an imaging array), in which case the second region (which may be a substrate or epi-layer, for example) may be common to the SPADs. This can reduce the circuit complexity and allow a greater density of contacts. Likewise, the second contact may be common to the SPADs, and may for example be a ground connection.

In a further aspect of the invention there is provided a method of fabricating a single photon avalanche diode, SPAD, in a CMOS integrated circuit fabrication process, the method comprising: forming a first region, comprising a deep well of a first conductivity type, above a second region of a second conductivity type; connecting a first contact to the first region via a conductive pathway of the first conductivity type; connecting a second contact to the second region via a conductive pathway of the second conductivity type; and controlling the doping in the vicinity of the first region such that the breakdown voltage is smaller at the junction between the bottom of the deep well and the second region than elsewhere around the first region, whereby the junction forms a SPAD multiplication region when an appropriate bias voltage is applied between the contacts.

In another aspect of the invention there is provided a method of fabricating a single photon avalanche diode, SPAD, in a CMOS integrated circuit fabrication process, the method comprising: forming a first region of a first conductivity type on or in a second region comprising an epi-layer or substrate of the circuit, the epi-layer or substrate being of a second conductivity type; connecting a first contact to the first region via a conductive pathway of the first conductivity type; connecting a second contact to the second region via a conductive pathway of the second conductivity type, the first and second contacts being arranged on the same surface; and controlling the doping in the vicinity of the first region such that the breakdown voltage is smaller at the junction between the bottom of the first region and the second region than elsewhere around the first region, whereby the junction forms a SPAD multiplication region when an appropriate bias voltage is applied between the contacts.

The method may further comprise forming a doping gradient in the substrate so as to create a drift field in the substrate. Forming the first region may comprise forming a deep well, and may further comprise forming a guard ring region around the first region. Forming the guard ring region may comprise blocking the formation of a well next to the first region. The doping gradient applied to the epi-layer may assist in meeting the guard ring requirement.

Forming the guard ring may also comprise creating a doping concentration of the second conductivity type that increases with depth. Forming the guard ring may alternatively comprise creating a doping concentration that is substantially uniform at different depths. In the latter case in particular, forming the first region may comprise creating a doping concentration that increases with depth, and/or reducing the doping concentration of the first region at its horizontal periphery, for example by causing dopant to diffuse out at the periphery of the first region.

In one embodiment the guard ring region has the same conductivity type as the first region and has a relatively smaller doping concentration. In another embodiment the guard ring region has a different conductivity type to the first region and is lightly doped. The method may further comprise forming a plurality of guard ring regions having different structures.

The method may include implanting a deep enhancement region of the second conductivity type below the first region, and/or forming a highly doped region of the second conductivity type between the second contact and the second region.

In a further embodiment the method further comprises forming an inner well of the second conductivity type within the first region.

The method may also include connecting one of the contacts to a common voltage supply on the integrated circuit, which may be ground, and may include forming at least one MOS transistor, said at least one MOS transistor being electrically isolated from the substrate by a deep well of the first conductivity type.

With regard to the output of the SPAD, the method may include forming a high voltage compatible bias resistor for connecting one of the contacts to a positive breakdown voltage supply; forming an AC coupling unit and connecting the AC coupling unit to one of the SPAD contacts; or furthermore forming a CMOS read-out circuit and connecting the CMOS read-out circuit to the AC coupling unit output.

The method may further comprise forming at least one further SPAD, in which case the method may include connecting the second region to all of the SPADs, and/or connecting the second contact to all of the SPADs.

In a third aspect of the invention there is provided a single photon avalanche diode, SPAD, for use in a CMOS integrated circuit, the SPAD comprising: a deep n-well region formed above a p-type substrate; an n-well region formed above and in contact with the deep n-well region; a cathode contact connected to the n-well region via a heavily doped n-type implant; a lightly doped region forming a guard ring around the n-well and deep n-well regions; a p-well region adjacent to the lightly doped region; and an anode contact connected to the p-well region via a heavily doped p-type implant; the junction between the bottom of the deep n-well region and the substrate forming a SPAD multiplication region when an appropriate bias voltage is applied between the anode and cathode.

The terms 'lightly doped', 'heavily doped' and the like are principally used in relative terms, but should otherwise be interpreted in the context of standard features of commercial CMOS fabrication processes.

Where appropriate, custom implants and treatments may be used in place of specific CMOS process steps mentioned above if they have equivalent effect, although this will normally increase the cost of the process so is normally avoided where possible.

It will be appreciated that features described below in relation to double-drift fields and reflectors may be combined as applicable with any combination of features as aforesaid.

In particular, by way of example, a doping gradient may be applied to the first region to create a drift field in the first region (preferably in combination with the aforesaid feature of applying a doping gradient to the substrate (or epitaxial layer) to create a drift field in the substrate (or epitaxial layer). In the example where both the first region and substrate/epitaxial layer are doped so as to create a drift field, the doping gradients are preferably arranged in opposite directions. The drift field in the substrate preferably extends throughout the entire width of the substrate, but may alternatively only extend through a part of the width. This 'double-drift' field can improve the timing response of the SPAD by reducing the 'diffusion tail'.

Any of the SPADs as aforesaid (where applicable) may further comprise a reflective layer for reflecting back light that has passed through the SPAD multiplication region without detection. Optionally also the substrate may be thinned (or an initial thickness may be chosen) to enhance the sensitivity of the SPAD to detect light of a corresponding wavelength. Preferably (for applications where spatial accuracy is not paramount) the reflective layer is a non-specular reflector, such as a series of V-shaped grooves or pyramid structures and the like. The reflective layer may be separated from the SPAD multiplication region by (at least) an insulating layer, such as an oxide layer, in which case a bias may be applied to the reflective layer in order to enhance the drift field, or otherwise. The term 'non-specular' preferably connotes a type of reflection that substantially does not obey the law of reflection, which is to say that the reflector is not substantially retro-reflective for light incoming normal to the plane of the reflective layer. The non-specular reflection may be diffuse (that is, scattering light in essentially random directions) to a greater or lesser degree (for example, it may be fully diffuse or not diffuse at all, or may scatter light in only a small number of different directions, such as two). Thus in the present case (such as with the triangular, pyramid or other ordered/crystalline type features) the reflection of light may be ordered to a degree rather than being fully unpredictable, and in particular may be any reflection that increases the expected path length of the light within the substrate or epitaxial layer (and, as noted below, may be designed to ensure total internal reflection of the light when it reaches the silicon surface interface with CMOS dielectric layers). The reflective layer may be formed from a material having a particular reflectivity in relation to particular wavelengths of light. The material may for example be selected to have a high reflectivity of near-infrared light (NIR), such as aluminium, for example. The SPAD may be arranged in an array of similar devices, and the reflection of light may be at such an angle to cause one SPAD to detect light that was incident at another SPAD (as noted, this is less of a concern in range-finding and other applications where spatial resolution is not very or not at all important).

In a related aspect of the invention there is provided (without necessarily any of the limitations as aforesaid) an avalanche photo diode, APD, for use in an integrated circuit (such as a CMOS integrated circuit), the APD comprising: an avalanche effect multiplication region for detecting photons arriving via a light receiving surface; and a reflective layer disposed on an opposite side of the multiplication region to the light receiving surface, for reflecting photons back towards the avalanche region. Preferably the reflecting layer is a non-specular reflector. It will be appreciated that any combination of other features as aforesaid may nevertheless be included with this aspect, in particular (but not exclusively) in relation to FIGS. 17 to 25. The APD may for example be a SPAD, or another type of photo diode.

In this and previous variants and embodiments, the reflecting layer may be formed so as to cause total internal reflection of light incident parallel to the normal of the light receiving surface. Advantageously this feature may be provided in combination with a reflecting surface that, while not specular, is substantially not diffuse either, so that the angle of reflection can be controlled to a greater or lesser degree. Preferably a majority of light and more preferably substantially all of the light incident along the normal of the light receiving surface undergoes total internal reflection. The circuit is preferably configured such that the light is reflected back onto the reflective surface by an oxide or other layer with similar properties, such as the CMOS dielectric stack.

As before, the APD may further comprise an insulating layer between the substrate, with or without a graded profile or epi-layer, and the reflective layer on the back side.

In one embodiment the light receiving surface is the 'top' of the (for example, CMOS) circuit, in a 'front-side illumination' (FSI) mode as will be appreciated by the skilled man. In this embodiment the APD may comprise consecutive layers containing (optionally) an oxide layer (to assist with the total internal reflection), the APD circuit (or array thereof), the active multiplication region, the substrate and a reflective layer respectively, with the exposed side of the oxide layer constituting the light receiving surface. In another embodiment the light receiving surface is the back-side of the (for example, CMOS) integrated circuit, operating in a 'back-side illumination' (BSI) mode. In this embodiment the APD may comprise consecutive layers containing a reflective layer (formed for example from CMOS-process metalisation layers), an oxide layer (such as a CMOS dielectric stack), the APD circuit (or array thereof), the active multiplication region, the substrate and (optionally) an anti-reflective coating (the exposed side of which forming the light receiving surface). An anti-reflective coating may be applied to the light receiving surface in either embodiment to enhance the light transmission properties of the light receiving surface. As noted elsewhere, preferably the substrate at least is doped so as to create a drift field (preferably throughout the whole width of the substrate). An advantage of BSI is the ability to use an anti-reflective (AR) coating. An AR coating can greatly improve the absorption characteristics of the silicon at a desired light wavelength. In a BSI configuration, the choice of dielectric layers is not constrained by those required for MOSFET fabrication as is the case for FSI. In the BSI configuration, the reflective layer may be the CMOS metalisation layers on the front-side.

As noted above, in the BSI configuration, the reflective layer may comprise CMOS metalisation layers, and the APD may further comprise an anti-reflective layer between the light receiving surface and the multiplication region (for example, being the outermost layer that provides the light receiving surface).

In another aspect of the invention there is provided a solid state optical sensor for use in an integrated circuit, the sensor comprising: an optical detection region for detecting photons arriving via a light receiving surface; and a non-specular reflective layer disposed on an opposite side of the optical detection region to the light receiving surface, for reflecting photons back towards the optical detection region. The device may for example be a SPAD, APD or other optical sensor. This aspect may be combined with any appropriate features as aforesaid. For example, the non-specular reflective layer may be substantially fully or partially diffuse, and the optical sensor may comprise an array of sensor devices. This aspect may particularly apply to optical sensors which are non-position sensitive, such as a large area avalanche photodiode.

In a further aspect there is provided a solid state near infrared (NIR) light detector, comprising an optical detection region for detecting photos arriving via a light receiving surface; and a reflective layer disposed on an opposite side of the optical detection region to the light receiving surface. The detector may be configured to operate with a ranging or communications device, for example a device operable to carry out 3D time-of-flight imaging and associated devices like pinned photodiodes and photogates. The reflective surface is preferably substantially specular or at least non-diffuse.

In a yet further aspect there is provided a method of fabricating a SPAD (or, more generally, APD) with a reflective layer as aforesaid. The aforesaid methods may further comprise applying a doping gradient to the first region to create a drift field in the first region. This feature is preferably provided in conjunction with the feature that a doping gradient is applied to the substrate (or epilayer) to create a drift field in the substrate (or epilayer), so as to create a 'double drift' field. The method may further comprise fabricating the SPAD using a single mask. This preferably comprises constructing a guard ring with a graded doping profile of substrate that increases with depth.

As a consequence, the SPAD may be fabricated prior to a MOSFET fabrication stage. Thus the method may further comprise relaxing thermal budget constraints, which can improve performance due to more extensive annealing.

Although various aspects and embodiments of the present invention have been described separately above, any of the aspects and features of the present invention can be used in conjunction with any other aspect, embodiment or feature where appropriate. For example apparatus features may where appropriate be interchanged with method features.

DESCRIPTION OF THE DRAWINGS

An example embodiment of the present invention will now be illustrated with reference to the following Figures in which.

DETAILED DESCRIPTION OF AN EXAMPLE EMBODIMENT

In the foregoing description, it will be appreciated that the examples given with regard to p-type and n-type materials can apply equally if the conductivity types are reversed (that is, n-type material is replaced by p-type and vice versa) with appropriate reversals of voltages, anodes/cathodes and the like. Portions of this document assume a p-type substrate as this is mostly standard in CMOS integrated circuits.

Figure 1:
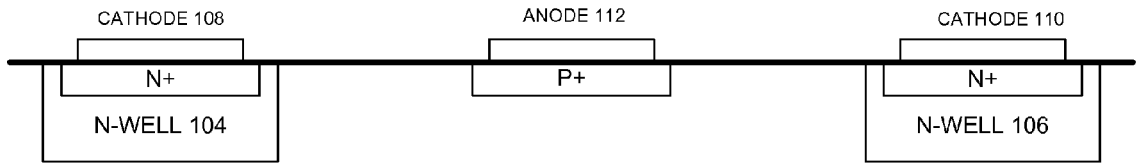
FIG. 1 is a schematic of a prior art lateral PIN photodiode.
Figure 2:
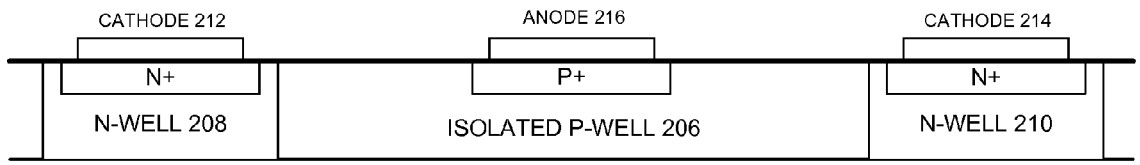
FIG. 2 is a schematic of another prior art lateral PIN photodiode.
Figure 3:
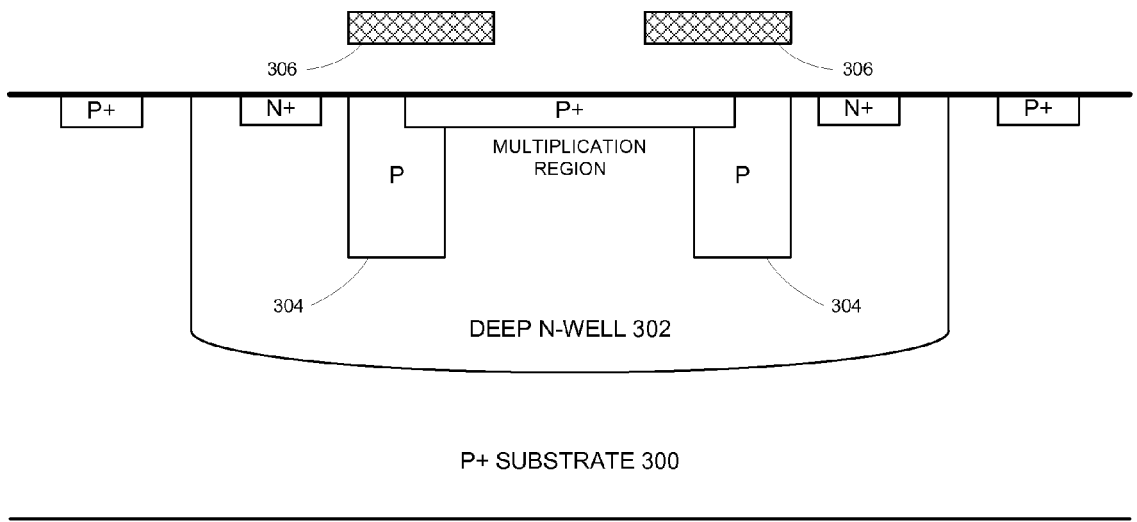
FIG. 3 is a schematic of a prior art single photon avalanche diode (SPAD)
Figure 4:
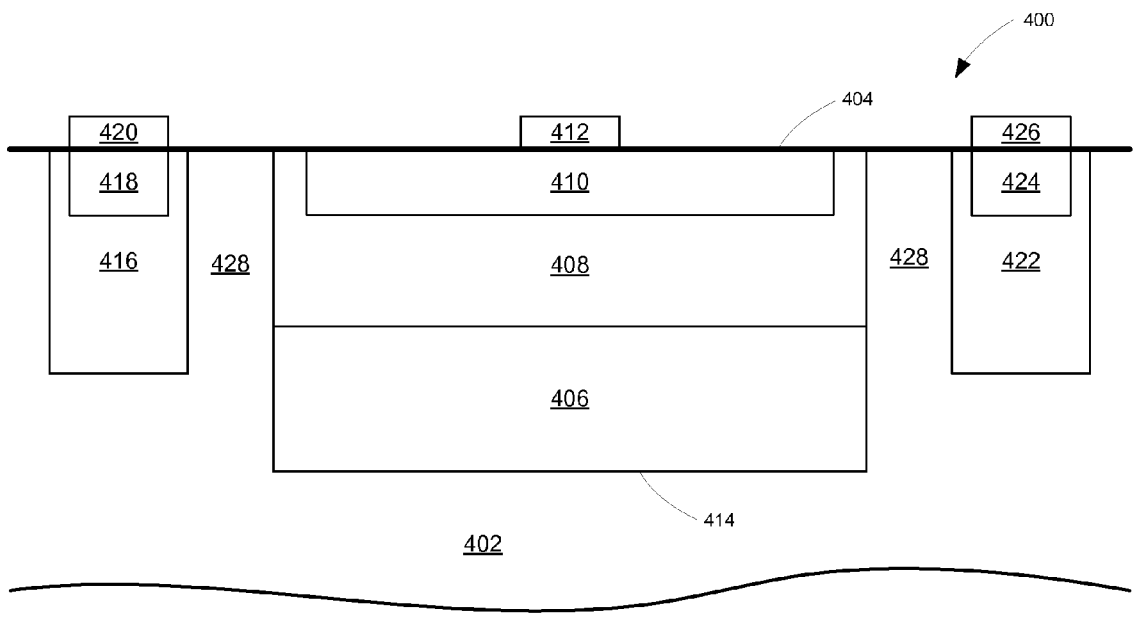
FIG. 4 is a schematic of a SPAD in accordance with one embodiment.

FIG. 4 is a schematic of a first embodiment of a single photon avalanche diode (SPAD) that is fabricated as part of a CMOS integrated circuit 400. The SPAD 404 is formed in the epitaxial layer ('epi-layer') 402 that has been grown on a substrate (not shown). A deep well 406 is implanted into the epi-layer 402 and covered with a well of the same conductivity type 408 that is connected in turn to a heavily doped electrode implant 410 which is connected to the contact 412. An implant of opposite conductivity type 416, 422 is formed around a guard ring 428, with a heavily doped electrode implant 418, 424 connected to contact 420, 426. The SPAD multiplication junction 414, where avalanche breakdown occurs during use, is located at the junction between the bottom of the deep well 406 and the epi-layer 402.

In plan view (not shown) the well implant 416, 422 forms a ring around the well 408 and deep well 406 and is shown in cross section in FIG. 4 through its widest part. In a variant, the well 416, well 408 and well 422 are arranged in a discontinuous configuration, whereby one (or more) wells are provided, and one (or more) electrode contacts 420, 426 are provided. It will be appreciated that other configurations may be possible and that the structure described herein can be modified as appropriate for other geometries. For example a configuration can be envisaged without any contacts declared locally next to the SPAD, instead using the natural substrate contacts used in other parts of the CMOS device. The skilled man would appreciate that any appropriate guard ring structure can be used in this instance providing the relevant requirements are met.

In this embodiment, the n-well, p-well, deep n-well or p-well and anode and cathode implants are formed using standard CMOS processes, meaning that the SPAD 404 is relatively cheap and easy to fabricate. The guard ring 428 is formed by blocking well formation between the well 416, 422 and the opposite type well 408, and by taking advantage of the doping gradient inherent in the epi-layer, having increasing dopant concentration with increasing depth; near the surface the decreased dopant concentration leads to a higher breakdown voltage than at the SPAD multiplication junction 414. In addition, the deep well 406 has a retrograde doping concentration, whereby the dopant is most concentrated at the bottom of the well, helping to ensure that the junction 414 has the smallest breakdown voltage of all of the peripheral areas of the well 406.

During use, avalanche breakdown at the junction 414 is caused by the formation of photoelectrons by incident light. Because the junction 414 is relatively deep, the SPAD is relatively responsive to longer wavelength light, which tends to excite electrons deeper in the substrate or epi-layer than shorter wavelength light.

In a typical configuration, one of the sets of contacts 412 and 420, 426 is connected to ground, and a reverse bias is applied via the other contact. The well 416, 422 and electrode implant 418, 424 provides a uniform and low resistance circuit path for the avalanche current to discharge when the SPAD is activated. The read-out circuitry for the SPAD is discussed later. In a less efficient variant a non-uniform and/or high resistance circuit path is provided.

The net result of the features described above is improved photon detection at red and NIR wavelengths compared to previous SPADs. The detector can be approximately three times more sensitive to red light (700 nm) than prior technology. It can also be approximately five times more sensitive to 850 nm near infra-red (NIR) than prior technology. The NIR sensitivity improvement is particularly important for ranging applications where it is beneficial if the illumination source is invisible to the naked eye. In ranging applications, assuming that the illumination source and the reflecting object are point sources, the radar equation shows that the five times IR sensitivity results in a 625-fold increase in range for the same illumination power, or a 625-fold decrease in illumination power for the same range, all else being equal. Importantly, this detector is more likely to enable eye-safe range detection in consumer products. The lower required power consumption of the light source is obviously important for portable electronics running on batteries. (For other variations in sensitivity, it is noted that the range can be computed as the fourth power of the increase, according to the Radar equation)

Because the device of FIG. 4 exists in the substrate (or epi-layer) the anode terminal (in the p-substrate case) will normally be common to the rest of the chip (usually ground). This could equally apply to the cathode, if an n-substrate process was used. In this case the method of connecting a bias voltage to the SPAD is to the cathode terminal and this has to have positive polarity in order to reverse bias the diode. The breakdown voltage of such a SPAD constructed from a deep well and the substrate/epi-layer will usually be relatively high because of the low doping concentrations involved. This can reduce the noise count rate due to band-to-band tunnelling, but may raise the jitter of the detector.

Figure 5:
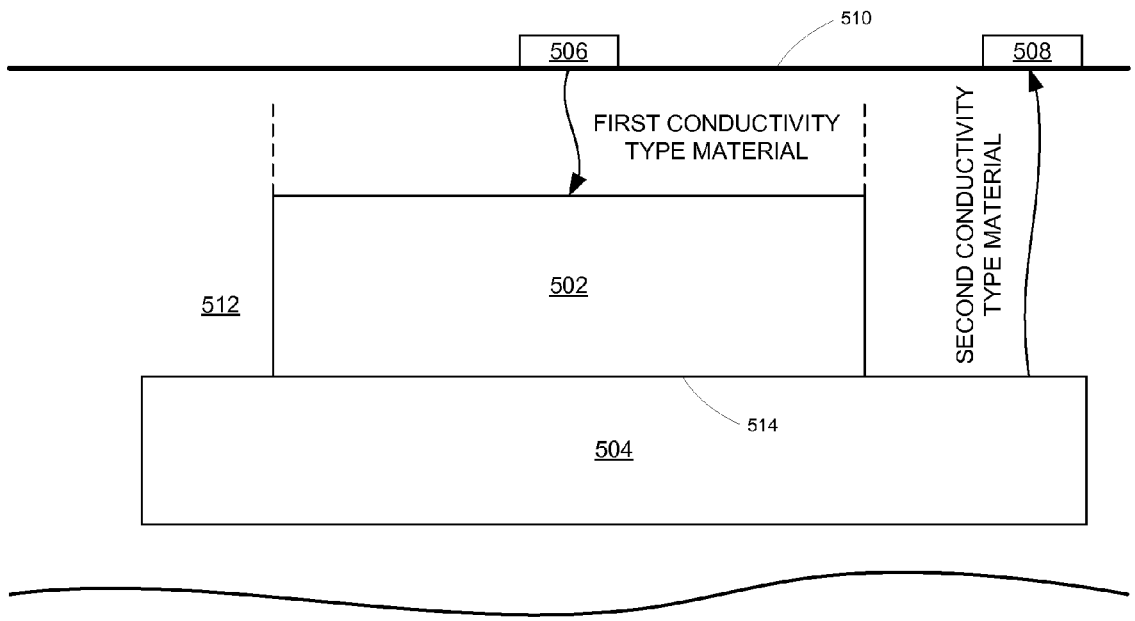
FIG. 5 is a schematic of a SPAD in accordance with another embodiment.

FIG. 5 is a schematic of a SPAD in accordance with another embodiment. This embodiment (and the subsequent embodiment of FIG. 6) can have a more general application than the specific example given in FIG. 4.

In the embodiment of FIG. 5, a deep well 502 of a first conductivity type (n or p) is formed on a region 504 of a second conductivity type (p or n respectively), creating a SPAD multiplication region 514 (when suitably biased). The second region may for example be a standard or non-standard CMOS implant, or a substrate or epi-layer. A first electrode contact 506 is connected to the deep well 502 via a conductive pathway through material having the same first conductivity type. A similar connection is made from the second region 504 to another contact 508 via material having the second conductivity type. Both contacts are formed on the same surface 510. Accordingly a deep well 502 (either a deep n-well or a deep p-well) is used to create a SPAD having the advantage of the SPAD of FIG. 4 that it is sensitive to relatively long wavelengths of light, due to the depth of the bottom of the deep n-well, which may for example be approximately 2 μm deep into the substrate.

Figure 6:
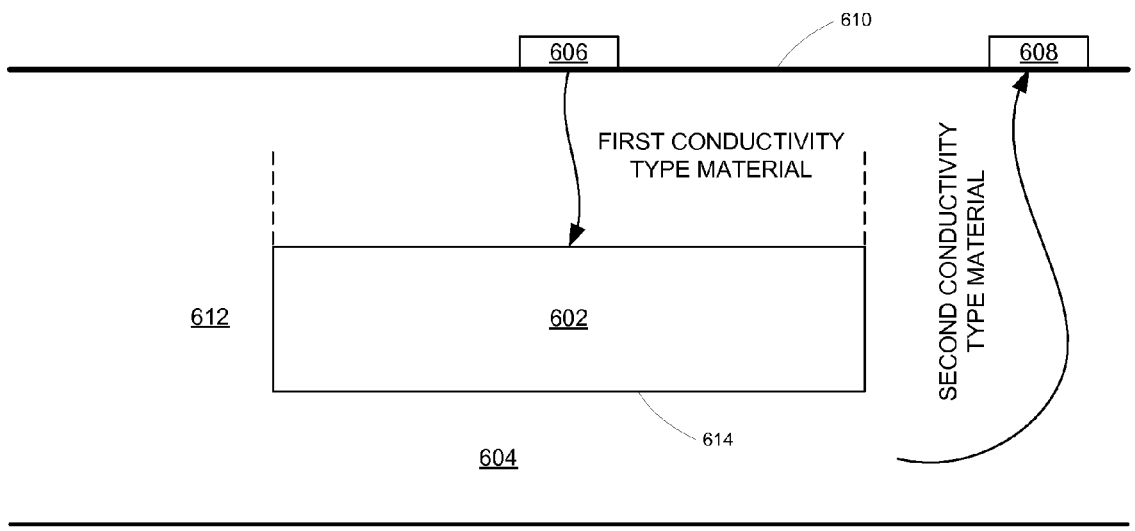
FIG. 6 is a schematic of a SPAD in accordance with a further embodiment.

FIG. 6 is a schematic of a SPAD in accordance with a further embodiment.

In the embodiment of FIG. 6, a first region 602 of a first conductivity type is embedded in a substrate or epi-layer 604, creating a SPAD multiplication region 614. As before, the first region is connected to the electrode contact 606 via a region of the first conductivity type. The substrate or epi-layer 604 connects to the contact 608 (on the surface 610) via material having a second conductivity type. Again this forms the basis of a simple SPAD.

The first region 602 may be one of a number of possible standard and non-standard doping implants, including but not limited to a deep well. The first region 602 and corresponding junction 614 may for example be located more or less deeply within the substrate than the deep well embodiment of FIG. 5, allowing the optical response to be varied while maintaining the convenience of a circuit path through the substrate (requiring fewer features to be formed).

In the two embodiments illustrated in FIGS. 5 and 6, it will be appreciated that, in accordance with the basic operation of a SPAD as described elsewhere, the SPAD multiplication region exists because the breakdown voltage is smaller at the junction between the bottom of the first region (or deep well, in particular) and the second region than elsewhere around the first region (references 512 and 612), when an appropriate bias voltage is applied between the contacts. Examples have been given elsewhere of guard ring configurations and the like which fulfill this criteria.

Various configurations are described below which embody various combinations of the simple SPAD structures described above with reference to FIGS. 5 and 6.

First, specific examples of the SPAD of FIG. 4 will be given, illustrating the general equivalence between p-type and n-type 'mirror image' versions of the SPAD.

Figure 7:
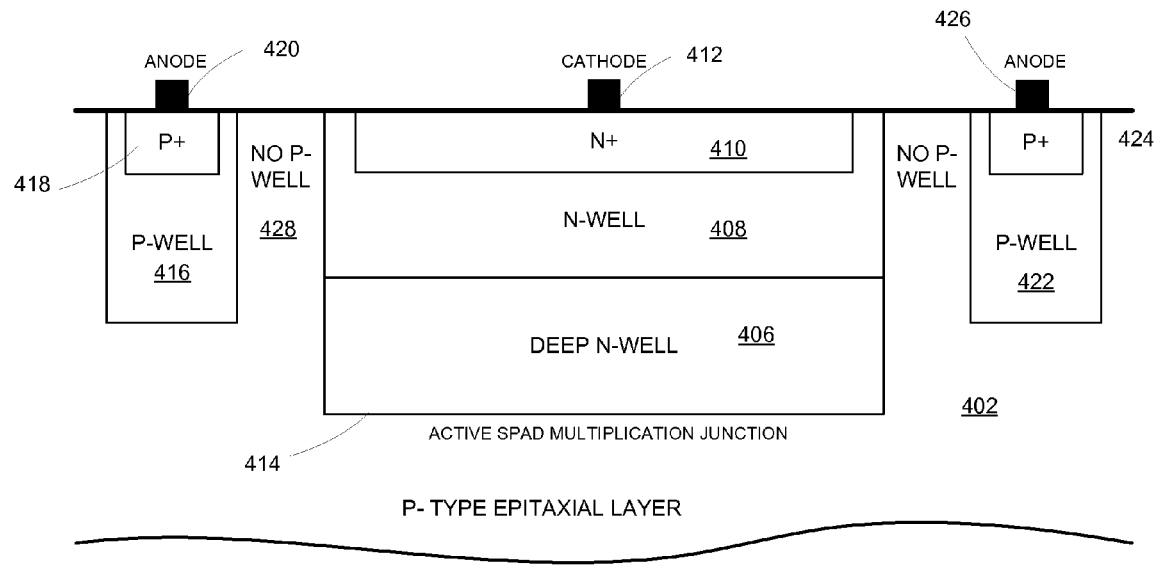
FIG. 7 is a schematic of a first variant of the SPAD of FIG. 4 based on a p-type substrate.

FIG. 7 is a schematic of a first variant of the SPAD of FIG. 4 based on a p-type substrate.

In FIG. 7, a deep n-well is formed within a p-type epitaxial layer, creating an active SPAD multiplication junction at the bottom of the deep n-well. An n-well is formed above the deep n-well to ensure good electrical conductivity, and a heavily doped n+ implant is formed for the cathode contact. A p-well implant is formed around the n-well, separated by a guard ring in a zone where the formation of a p-well is prohibited (for example by masking during the fabrication process). The p-well is connected to the anode contacts by a heavily doped p+ region. In use the anode is connected to ground and a bias voltage is applied to the cathode.

Figure 8:
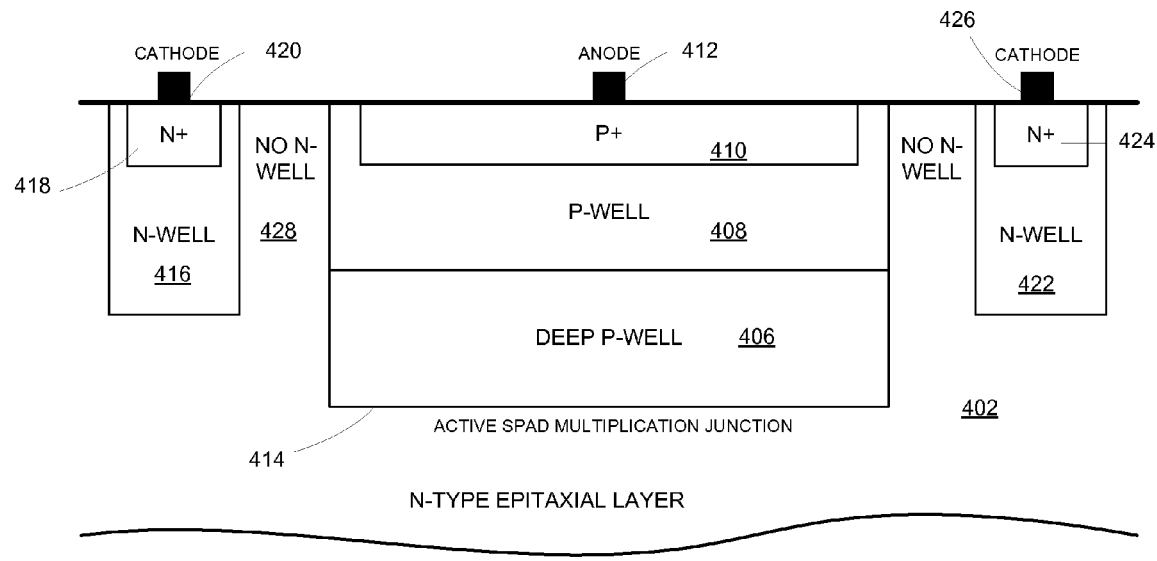
FIG. 8 is a schematic of a second variant of the SPAD of FIG. 4 based on an n-type substrate.

FIG. 8 is a schematic of a second variant of the SPAD of FIG. 4 based on an n-type substrate.

In FIG. 8, a deep p-well is formed within an n-type epitaxial layer, creating an active SPAD multiplication junction at the bottom of the deep p-well. A p-well is formed above the deep p-well to ensure good electrical conductivity, and a heavily doped p+ implant is formed next to the anode. An n-well implant is formed around the p-well, separated by a guard ring in a zone where the formation of an n-well is prohibited. The n-well is connected to the cathode contacts by a heavily doped n+ region. In use the cathode is connected to ground and a bias voltage is applied to the anode.

The variant shown in FIG. 7 is more common than the variant of FIG. 8, but it will be appreciated that both are possible. In the remainder of the description below it will be assumed that a p-type substrate is being used but it will be appreciated that the conductivity types can be reversed if desired.

It will also be appreciated that the high positive breakdown voltage of the SPAD is not compatible with standard CMOS transistor gates. One method of creating a high voltage compatible 'quench' resistor in CMOS is to use a highly resistive poly layer to connect the cathode of the SPAD to a positive breakdown voltage supply. Moreover, the SPAD cathode, which is the moving node that falls in response to the avalanche current, cannot be directly connected to the CMOS inverter gates because it is also at a high DC bias level ($+V_{BD}$), see FIG. 9). Therefore, one solution is to AC-couple the SPAD moving node to subsequent CMOS readout circuitry to ensure DC compatibility.

Figure 9:
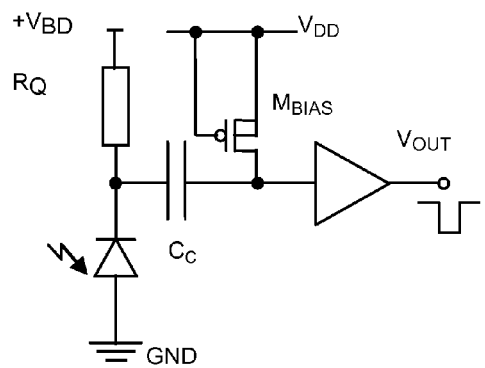
FIG. 9 is a schematic of a read-out circuit for the SPAD of FIG. 4.

FIG. 9 is a schematic of a read-out circuit for the SPAD of FIG. 4. The quench resistor $R_Q$ is shown in series with the SPAD, and the coupling capacitor $C_C$ is connected to the cathode on one side, and to an inverter on the other. In some variants the inverter can be omitted (for example if dealing with MOS transistor configurations that are not limited to digital logic). A bias transistor $M_{BIAS}$ is also connected to the inverter input. The readout voltage $V_{OUT}$ is a well conditioned CMOS signal that can be fed directly into subsequent read-out and/or processing circuitry, such as digital logic.

A number of different arrangements of the SPAD guard ring are possible, as is illustrated in a number of variants described below. As with the read-out circuit of FIG. 9, a p-substrate/deep n-well configuration is assumed.

Figure 10:
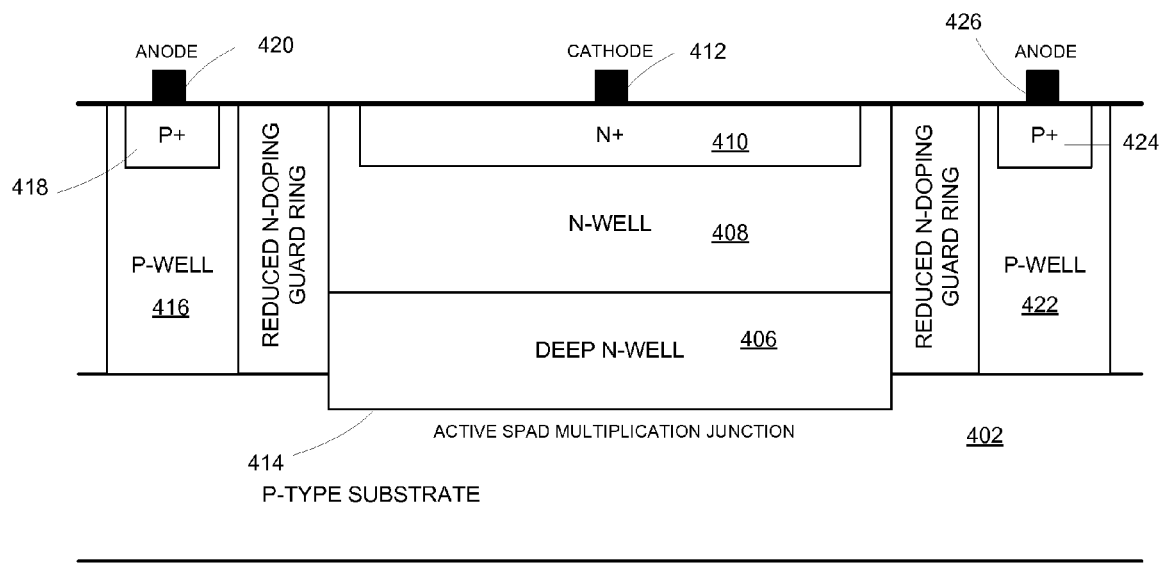
FIG. 10 is a schematic of a third variant of the SPAD of FIG. 4.

FIG. 10 is a schematic of a third variant of the SPAD of FIG. 4.

In this variant, the prohibited p-well region in the guard ring (the 'bare' epi-layer) is replaced by a reduced n-doping region, which fulfils the necessary function of maintaining the breakdown voltage around the n-well above the breakdown voltage at the active SPAD multiplication junction at the bottom of the n-well.

Figure 11:
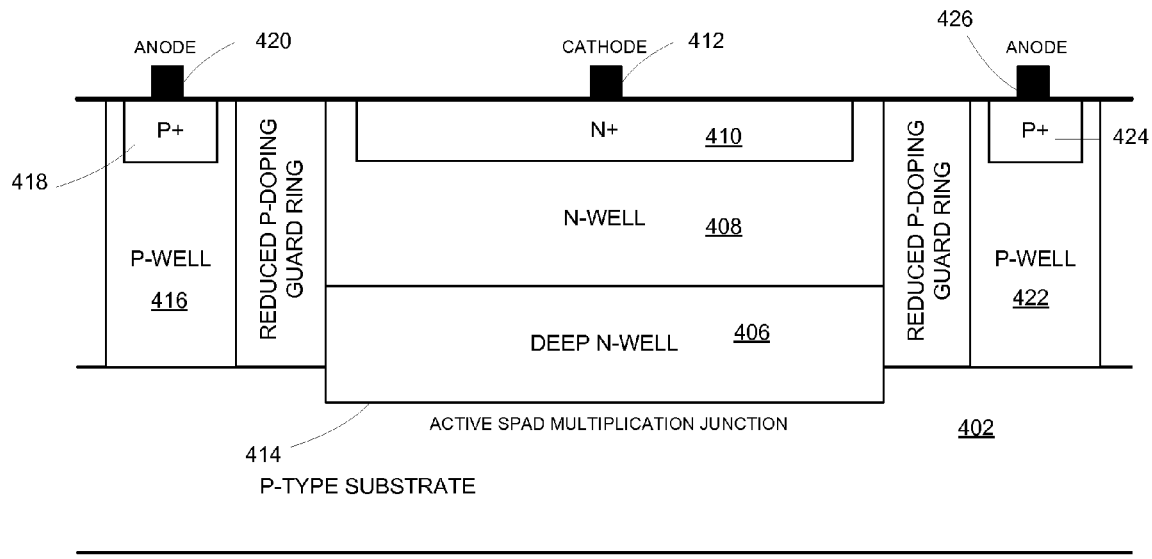
FIG. 11 is a schematic of a fourth variant of the SPAD of FIG. 4.

FIG. 11 is a schematic of a fourth variant of the SPAD of FIG. 4.

In this variant, the guard ring is again filled with a doped region, but this time the guard ring is lightly p-doped.

Figure 12:
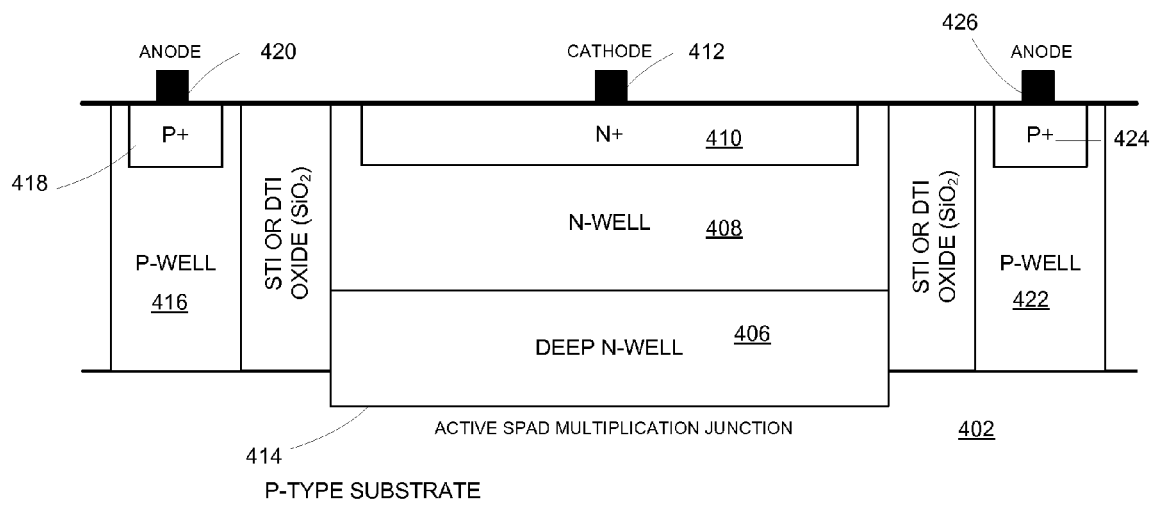
FIG. 12 is a schematic of a fifth variant of the SPAD of FIG. 4.

FIG. 12 is a schematic of a fifth variant of the SPAD of FIG. 4.

In this variant, shallow trench isolation (STI) is used to form the guard ring region. As noted earlier on, Shallow Trench Isolation can work as a guard ring because its permittivity is lower than silicon, allowing it to dissipate high electric fields successfully. The use of STI results in high fill-factor as there is no need for allowing space to account for the diffusion of the p-well guard ring.

The fabrication of STI involves plasma etching which creates secondary X-rays which potentially create deep-level defects in the surrounding silicon, exponentially increasing the dark count rate (DCR). In some instances deep trench isolation (DTI) may additionally be required to ensure the guard ring contacts all of the region around the device.

A feature common to some or all of the guard ring constructions described above is that they achieve a desired increase in peripheral breakdown voltage and thus permit effective Geiger mode operation.

The use of lattice stress to increase the mobility and thus transistor performance which is a technique used in advanced nanometer CMOS processes is also undesirable as it creates defects which enhance DCR.

Figure 13:
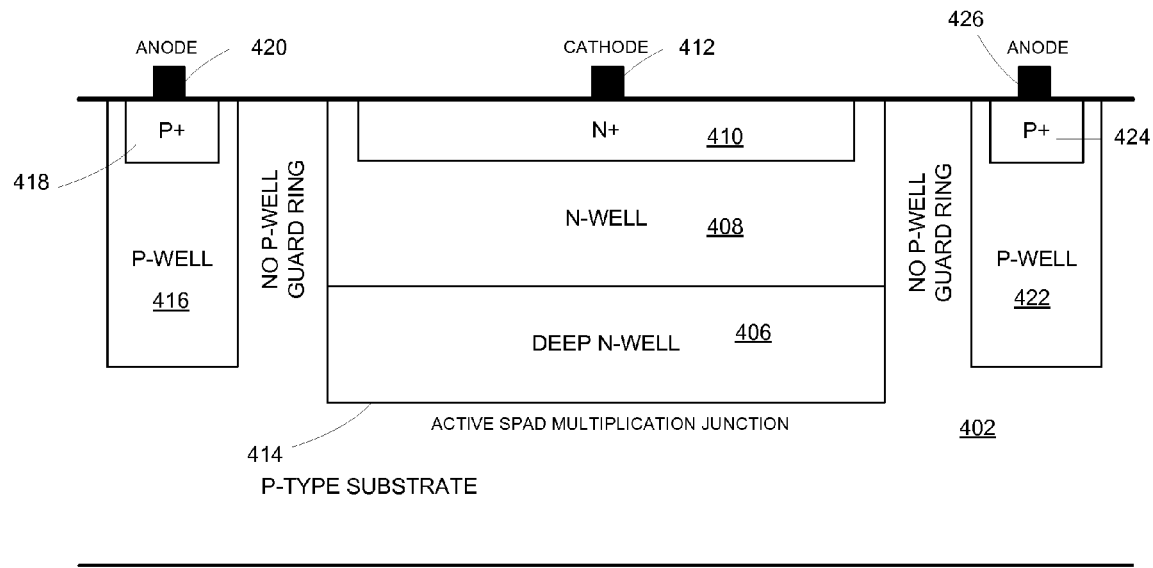
FIG. 13 is a schematic of sixth variant of the SPAD of FIG. 4.

FIG. 13 is a schematic of sixth variant of the SPAD of FIG. 4.

In the variant of FIG. 13, the SPAD is embedded directly into the substrate. The features of the deep n-well, n-well, p-well, anode and cathode implants are provided as before, and p-well formation is prohibited in the guard ring area. The doping in the substrate around the n-well needs to be controlled to ensure that the lowest breakdown voltage still occurs at the junction at the bottom of the n-well, and the other guard ring embodiments may of course be adapted for use in this variant.

Figure 14:
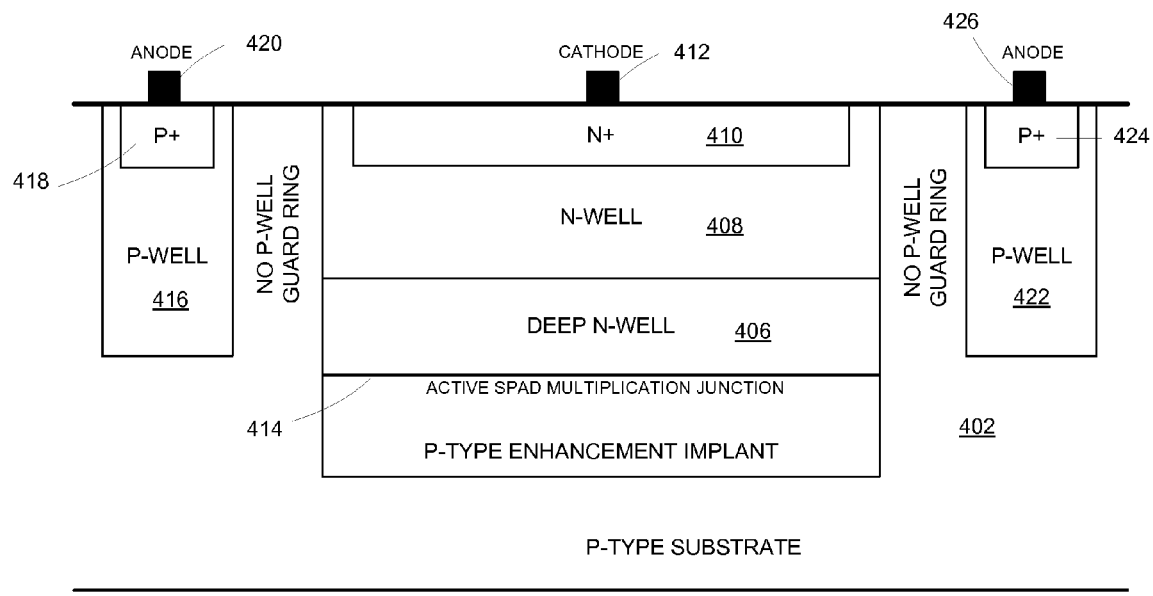
FIG. 14 is a schematic of a seventh variant of the SPAD of FIG. 4.

FIG. 14 is a schematic of a seventh variant of the SPAD of FIG. 4.

In the variant of FIG. 14 a p-type enhancement implant is provided beneath the deep n-well, to lower the breakdown voltage at the junction at the bottom of the deep n-well. This variant may for example be combined with the previous variant of FIG. 13.

Figure 15:
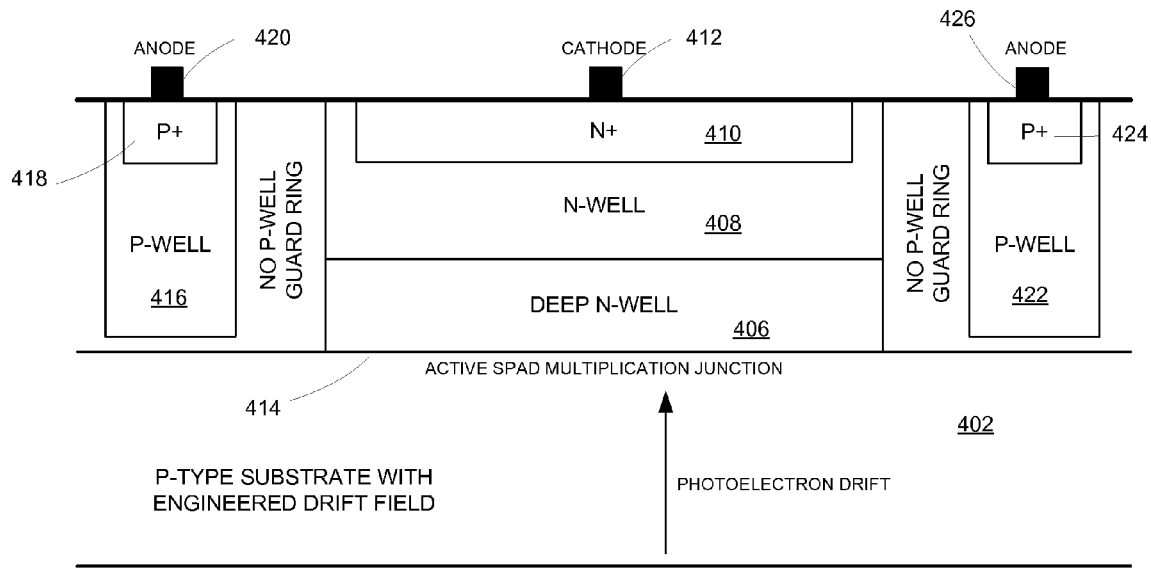
FIG. 15 is a schematic of an eighth variant of the SPAD of FIG. 4.

FIG. 15 is a schematic of an eighth variant of the SPAD of FIG. 4.

In the variant of FIG. 15, a drift field is engineered in the p-type substrate so that photoelectrons dislodged by photons are directed towards the SPAD multiplication boundary. This also assists in guard ring formation as it ensures that the steepest gradient of doping concentration, and thus the lowest breakdown voltage, occurs at the bottom of the deep n region.

Figure 16:
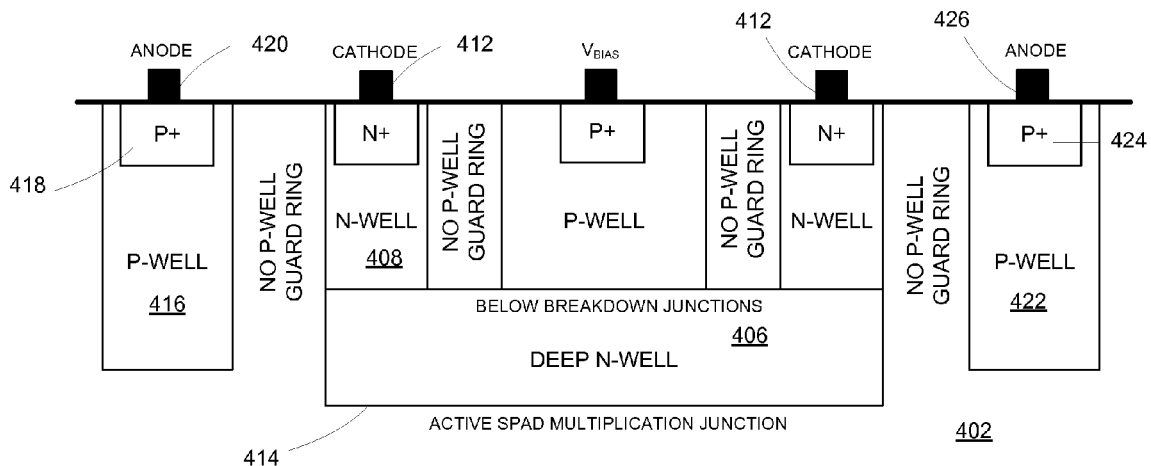
FIG. 16 is a schematic of a ninth variant of the SPAD of FIG. 4.

FIG. 16 is a schematic of a ninth variant of the SPAD of FIG. 4.

In this variant, a p-well is inserted in the middle of the n-well, with associated guard ring to ensure that the lowest breakdown voltage remains, as before, at the junction between the bottom of the n-well and the p-type substrate (or epi-layer).

The proposed device structure in all similar variants and embodiments also offers applications for back side illumination (BSI) processes where the same epitaxial graded type substrate is used to manufacture the transistors and photodiodes in a standard imaging process. The proposed SPAD structure would be ideal for BSI applications as there is no secondary junction to prohibit the detection of photoelectrons generated in the substrate which means that it can realise broad spectrum sensitivity. In a very thin back side illuminated wafer, the proposed SPAD structure would offer the opposite behaviour and would provide enhanced blue response because the junction would be close to the back-illuminated side. The thickness of the wafer in BSI configuration can be tuned to achieve the desired wavelength response of the SPAD.

Because the proposed structure of FIG. 4 et al only uses only n-well and deep n-well (except for a grounding anode ring), there is less difficulty associated with n-well to p-well spacing design rules present in modern CMOS processes. Therefore, the potential is available for a high fill-factor SPAD pixel using only NMOS devices to detect and buffer the SPAD output pulse.

Another advantage of the NMOS only configuration realisable with this detector technology is that a high density of ground contacts can be made in the vicinity of the SPADs, reducing electrical crosstalk. This is because there are no n-well to p-well spacing rules that would be required if the SPADs shared a common breakdown voltage through a deep n-well. This enables p-well ground contacts to be made with high density all over a pixel array, and indeed, as part of the SPAD guard ring structure.

Furthermore, it is known that small SPAD devices exhibit improved dark count rate statistics compared with larger devices, due to the lower probability of a trap existing in the active region of the device. Small devices (with a radius of less than 16 µm, for example) can be optimal for this device construction because of the low doped, and hence highly resistive, p-epitaxy used as the anode which causes large devices to have high internal resistances due to the lengthened current flow path. Small devices will therefore have improved after pulsing and noise performance by enhancing the extraction of the carriers created by the avalanche pulse because the mean distance that carriers must flow to the contact is reduced.

In one embodiment the furthest extent of the deep well is approximately 4 µm from the centre of the device; the guard ring is approximately 1 µm in width; and the farthest part of the device (the anode and p-well feature) is between approximately 5 and 6 µm from the centre. A preferred size of the active junction of the SPAD may typically be less than $10^{-5}$ cm$^2$. The depth of a typical deep n-well in an embodiment is 2 µm, but this may vary up or down depending on specific requirements for a device and also on the specifics of the CMOS fabrication process.

In the context of integrated specialised SPAD solutions in a customised CMOS process, such as an imaging specific process, further improvement could be made to this SPAD structure. For low cost and high practicality integration of SPADs into CMOS products it needs to be possible to generate the high breakdown voltage supply on chip. This presents a problem for the above SPAD structure because any high voltage supply would generate the high voltage on the deep n-well. Therefore, the SPAD junction and supply would break down at the same voltage, making Geiger mode operation impossible. To avoid this problem, the breakdown voltage of the DNW in the SPAD needs to be lowered. This can be achieved in two ways: increasing the doping concentration of the SPAD deep n-well implant either by an additional n-type implant or by increasing the initial doping concentration of the SPAD implant; or alternatively, adding an additional p-type implant under the SPAD deep n-well. The first option requires an additional SPAD-specific implant which may be costly. However, the second option may make use of some imaging specific deep p-implants used for reduction of colour crosstalk in CMOS image sensors and may be cheaper and more practical as a result.

Additionally, this device could be used as part of a larger imaging array. Some 'fill factor' could be recovered due to the drift of photoelectrons in the substrate. The device could also be used as a scientific detector by engineering a drift field in the substrate to sweep minority carriers towards the cathode for detecting photoelectrons generated by high energy particles, and so on.

Figure 17:
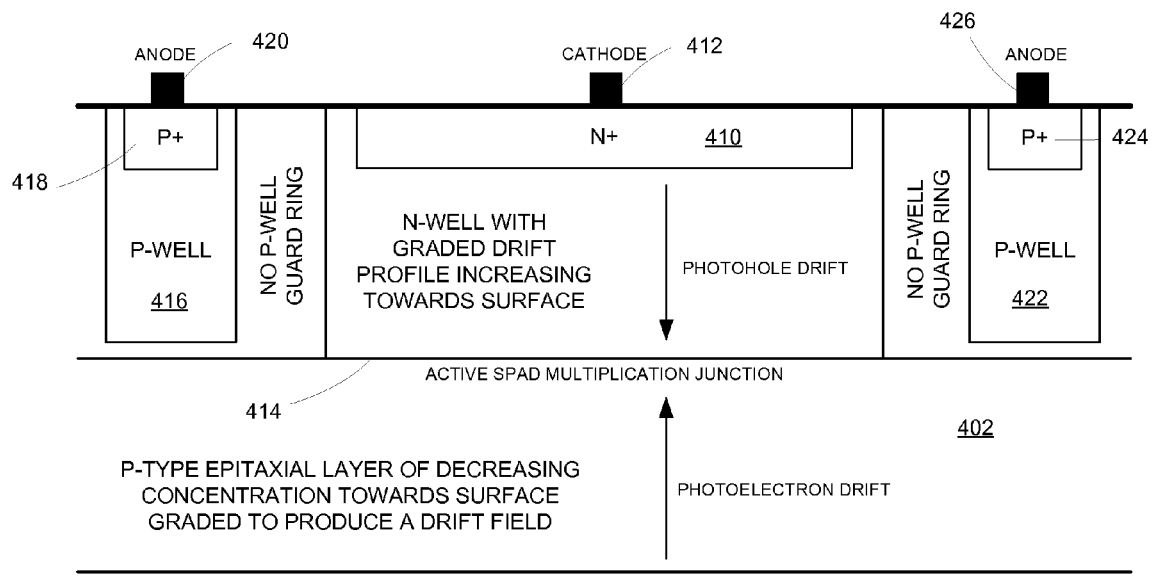
FIG. 17 is a schematic of a SPAD in accordance with a yet further embodiment, based on the eighth variant of FIG. 15.

FIG. 17 is a schematic of a SPAD in accordance with a yet further embodiment, based on the eighth variant of FIG. 15. In this embodiment, a custom mask and implant are used to engineer a double drift doping profile to exert an electric field on photocarriers generated either side of the SPAD multiplication junction. The so-called 'drift-field' accelerates carriers towards the junction, reducing recombination, increasing avalanche generation and thus increases the detection efficiency. In this embodiment a single mask can be used to define a SPAD which would improve yield similar to the self-aligned process for MOSFET fabrication. Additionally, a custom implant would remove the reliance of the SPAD on MOSFET implants allowing thermal budget constraints to be relaxed leading to higher device yields and lower noise as a result. The two drift fields from the SPAD n-well and the epitaxial layer combine to create a double-drift field.

Figure 18:
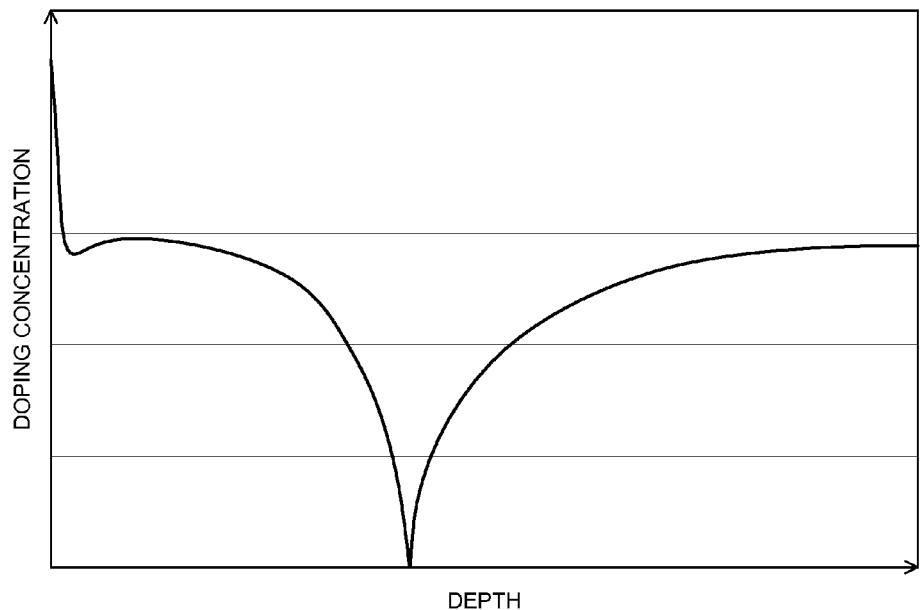
FIG. 18 is an example doping profile for the n-well and epitaxial layer of the SPAD of FIG. 17.

FIG. 18 is an example doping profile for the n-well and epitaxial layer of the SPAD of FIG. 17. The example in FIG. 18 is just one example of a double-drift profile. Any doping profile could be created with steeper or shallower doping concentration gradients. The grading of the doping concentration could be symmetrical or asymmetrical in the n- and p-type material to achieve the desired performance. The doping gradient could be extended to any depth to control the wavelength sensitivity of the device. The depth of the junction could also be modified to tune the spectral response to a specific wavelength in conjunction with, or separate from, altering the drift doping profile.

The example double drift doping profile illustrated in FIG. 18 improves performance of the SPAD because any photoelectrons generated below the p-n junction are subject to an electric field which accelerates them towards the junction. Similarly, any photoholes generated above the p-n junction in the n-type region at the surface also experience an electric field that accelerates them towards the junction.

The net result of the drift field for the two carriers, rather than just photoelectrons, is that the performance can essentially be doubled. A drift field can be beneficial for three reasons: 1) it can reduce the time it takes for a carrier generated far away from the junction to reach the junction and trigger avalanche breakdown and this therefore improves (lowers) the timing jitter of the detector; 2) because the time for each carrier to reach the junction and trigger breakdown can be reduced; the time available for the photocarrier to recombine (disappear) before reaching the junction is reduced and this results in more carriers reaching the junction and thus a higher photon detection probability can be achieved; and 3) the carriers generated far away from the junction are accelerated by the drift field, leading them to enter the high field multiplication junction at a higher velocity and since the avalanche breakdown probability is proportional to carrier velocity, a higher breakdown probability can be achieved and thus a higher photon detection efficiency can be realised.

Because of the degree of freedom arising from a custom SPAD n-well, the different drift doping profiles could potentially be engineered according to the properties of electrons and holes. It is known that holes have shorter lifetimes than electrons as minority carriers than electrons and have lower ionisation coefficients. Thus, assuming a symmetrical junction, photoelectrons would have a higher probability of initiating breakdown than a photohole created at equal but opposite distances from the junction. However, a custom SPAD n-well would allow the doping on the n-side to be lower doped, thus extending the hole lifetime, and more sharply graded with a higher field, thus increasing the hole velocity, and these two factors could be used to equalise the avalanche breakdown probability for electrons and holes, improving photon detection efficiency.

Features of the doping designed with the properties of electrons and holes in mind could be combined with any doping profile and degree of drift-field doping gradient to achieve the desired performance. The junction depth, doping concentration, and the extent of the drift field could be controlled to change the spectral response and timing response of the detector. The doping concentration could be lowered to extend the lifetimes of both electrons and holes, or to increase the breakdown voltage and reduce the noise of the device.

The different designs of guard rings described above may all (where appropriate) be incorporated into the design of the present embodiment in place of (or in addition to) the 'no p-well' guard ring pictured in FIG. 17.

As with other embodiments, the doping profile of the device is engineered so that the steepest doping gradient occurs in the planar junction parallel to the wafer surface, such that the breakdown voltage is smaller at the junction between the bottom of the first region and the second region than elsewhere around the first region, whereby the junction forms a SPAD multiplication region when an appropriate bias voltage is applied between the contacts. This can be realised with a custom implant mask by changing the implant dose and angle. By changing the angle of the implant, the lateral spreading of the dopant atoms in the wafer can be controlled to ensure a lower doped edge of the SPAD n-well perpendicular to the surface around the device's multiplication region. Blocking p-well fabrication around the edge of the device is also used to ensure good guard ring functionality.

It is expected that introducing a shallow drift field enhances the short-wavelength sensitivity of the detector which can be beneficial in some applications. This would therefore also increase the long wavelength sensitivity slightly as well because there is a probability, although small, that long wavelength photons are absorbed close to the silicon surface.

One advantage of the present embodiment (and others) is that it is possible to make a single mask SPAD. Having several masks means that alignment error during processing any one of the masks has a compound effect on the performance of the device. One of the major reasons behind the large rate of development of shrinking transistor technology is the self-aligned process which significantly increases transistor yields. Therefore it can be desirable from a yield point of view to have a single mask defining the whole device and this lends itself to rapid technology development and performance improvement.

Additionally, using a custom implant design, as disclosed above, offers the potential for significant performance improvement because it removes the dependence of the SPAD on standard CMOS implants. This is a critical result because once the dependence of the SPAD on the design requirements for MOSFET transistors is removed, this opens up a lot of potential avenues for performance improvement, the most significant of which is noise performance and yield improvement from additional annealing. To understand how noise improvements can be realised from using a custom mask for the SPAD a brief explanation of the constraints on modern CMOS processing is required.

Modern CMOS processes use ion implantation to introduce dopant species into a silicon wafer to create p-n junctions required for electronic devices. The advantage of ion implantation is that small features can be drawn and the resulting doping profile is very well controlled in the wafer, which is not possible with diffusion-based processes. However, ion implantation creates significant damage to the silicon lattice due to the high energy collisions between the dopant atoms and the silicon. This implant damage is therefore "annealed" after the implant to repair the silicon lattice and "activate" the dopant atoms and make them electrically active.

The annealing process is a high temperature step and a by-product of this is that some implanted atoms can move about, or diffuse, in the silicon to positions where they are not desired. As MOSFET devices have continued to shrink in CMOS nodes, it is important to achieve a well controlled doping profile to ensure stable transistor performance. Therefore, the trend in CMOS fabrication has been to use "rapid thermal annealing," or even laser annealing process steps, which act very fast to minimise dopant diffusion and maximise activation. CMOS processes tend to have very tight "thermal budgets" as a result of MOSFET design constraints.

From the CMOS process flow discussed above, two critical points arise for SPAD design: 1) implantation damage and 2) lack of annealing. These two parameters are potentially critical for SPAD performance because any implantation damage that creates defects in the SPAD will produce a trap which will vastly increase the noise of the device. Additionally, it is well understood that gettering and high temperature annealing steps reduce the defectivity of processes by healing silicon lattice defects and moving contaminants out of the silicon. However, gettering and long high temperature annealing steps are contrary to the requirements of modern advanced CMOS design because they degrade the reliability of MOSFET performance and violate the thermal budget. From a SPAD design point of view, what one would like to have is long high temperature annealing steps.

Having long high temperature steps is not possible if the SPAD design is based on MOSFET-related implants such as deep n-well and n-well, which are designed according to transistor requirements. However, this is possible if a custom SPAD mask was used. It may be that device performance could be improved by annealing for longer. If a custom implant and process was available, then this implant could be performed first, before any transistor-related implants, and annealed to create a really high quality SPAD junction. A high quality p-n junction used in the SPAD would exhibit low noise and improved yield.

If the SPAD implant was performed first and a first annealing/gettering step was performed on this implant before any of the MOSFET implants were performed there would not be thermal budget problems. Therefore, SPADs with custom masks would avoid the constraints of being tied to the wells used for MOSFETs which would open up freedom for design optimisation and potentially large noise and yield improvement.

Figure 19:
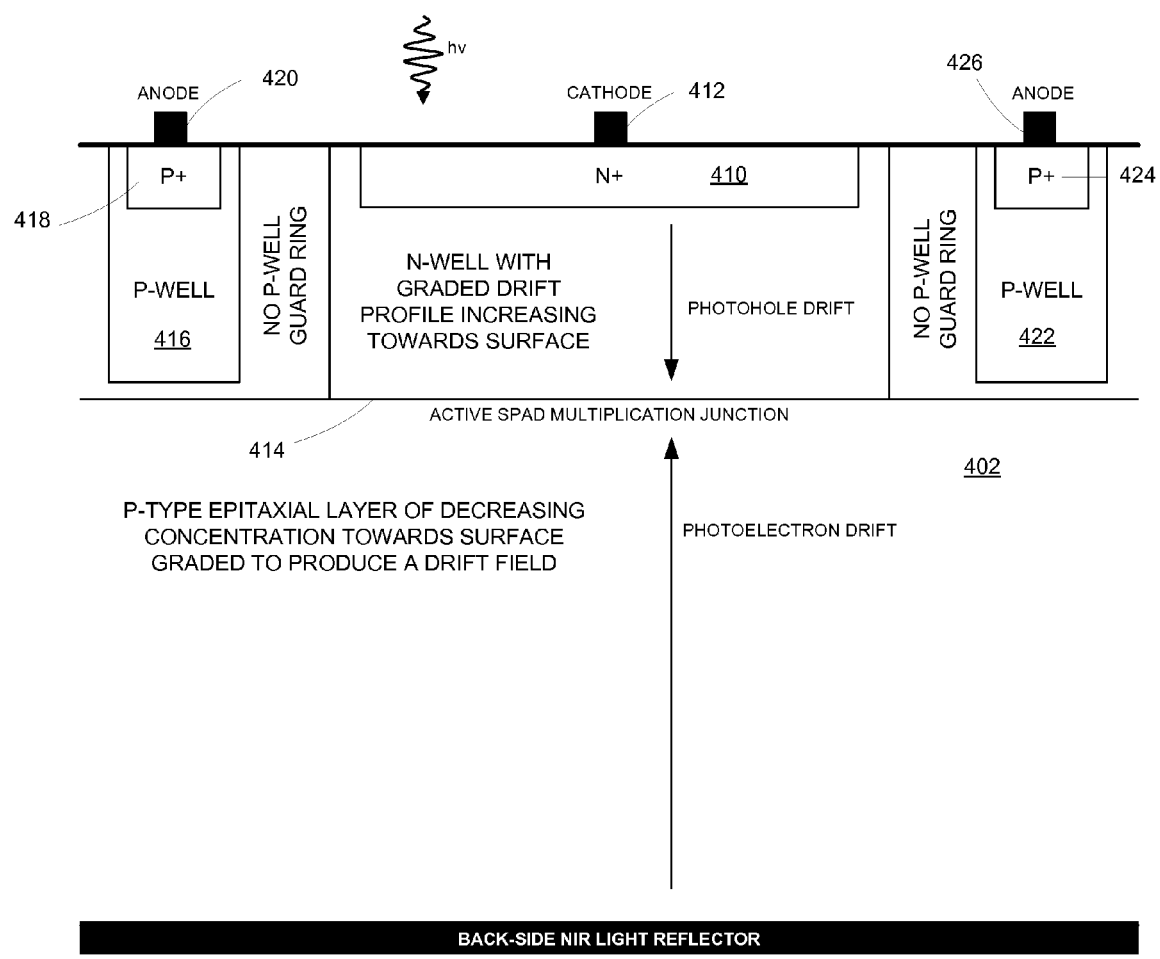
FIG. 19 is a schematic of a SPAD in accordance with a further embodiment having a back side or front side illumination configuration coupled with respectively either a front-side or back-side light reflector with substrate thinning.

FIG. 19 is a schematic of a SPAD in accordance with a further embodiment having a back side or front side illumination configuration coupled with respectively either a front-side or back-side light reflector with substrate thinning. This embodiment is based on the embodiment described above in relation to FIGS. 17 and 18 (in turn based on the variant described with reference to FIG. 15), but it will be appreciated that the additional features described below need not be limited to particular variants or embodiments of a SPAD described above but have more general application (with appropriate adaptations as necessary). In this figure and the subsequent one, an incoming photon is represented diagrammatically by the wave packet hv.

These inventions relate to improving the spectral response, near-infrared (NIR) detection efficiency, timing jitter of the present device. These improvements are realised by using the device in back side or front side illumination configuration coupled with respectively either a front-side or back-side light reflector with substrate thinning. This feature can enhance the optical generation profile in the silicon while reducing the timing jitter by reducing the time it takes for photoelectrons to reach the avalanche multiplication zone. Additionally, a back-side non-specular (essentially diffuse, in a broad sense) reflector in front side illumination can be used with a pyramidal or grooved surface to increase effective absorption lengths inside a thinned silicon substrate. The substrate can be thinned to achieve the desired combination of spectral response and timing jitter. Additionally, the back-side reflector can be used as a contact to increase the grounding of the substrate or as a metal-insulator-semiconductor gate like fashion to increase the drift field in the substrate to further enhance the timing and spectral response. In the back-side illuminated embodiment, a front side reflector can be used that is made out of the standard CMOS metalisation layers.

This embodiment can further improve the performance of the present device in two areas: extending and enhancing the spectral response in the infra-red (IR), and improving (reducing) the timing jitter. The performance improvement can be achieved through process customisation which moves away from the standard CMOS flow. However, all these process modifications would not influence transistor operation. The process modification would make it possible to have arrays of highly IR sensitive SPADs with CMOS integration.

As noted above, the two drift fields from the SPAD n-well and the epitaxial layer combine to create a double-drift (DD) field, but other configurations are possible as described above. The present embodiment relates to the use of light reflectors, back-side illumination, and anti-reflective coatings, and a combination of all of these features. For the standard front side illuminated case, where the light is incident from the "front" of the silicon wafer on the same side as the transistors and read out electronics, performance can be improved by thinning the substrate and placing a reflective layer (for example aluminium) on the back side. This can achieve an improvement in long wavelength sensitivity which can be desirable for CMOS SPADs. To understand how this works, first one must consider how electromagnetic waves propagate in silicon dependent on wavelength. Long wavelength (red) light has a very long absorption depth in silicon. For example, for 940 nm NIR light the absorption depth is approximately 54 µm and this means that approximately 66% of the photons are absorbed within this depth, whereas typically p-n junctions used for light collection only extend a few micrometers from the surface in advanced CMOS. The remaining photons are absorbed much deeper in the substrate and are usually not detected because they are generated far from the collection region, and recombine. However, if the substrate is thinned and a reflector placed on the back side, as illustrated in FIG. 19, then the incident light wave is reflected from the back surface and adds to the incident component to increase the overall generation rate close to the SPAD. This can lead to a reduced chance of recombination. If this feature is combined with substrate thinning and a drift field throughout the whole substrate, as described above, this can lead to very high detection efficiencies. Moreover, in a SPAD designed for range sensing using NIR light (a common application), the reduction of the distance that an average photoelectron is generated from the SPAD junction will reduce the timing jitter of the detector, leading to improved performance. In this way a reflector can be used to improve the overall SPAD performance.

Additionally, the reflector material can be chosen to be of optimal reflectivity for the light wavelength desired. If metallic, it can also be used to increase the rigidity of the grounding in the substrate which can have beneficial effects on the performance of an array of SPAD devices. Aluminium has good NIR reflectance properties and is commonly used in CMOS fabrication processes.

Figure 20:
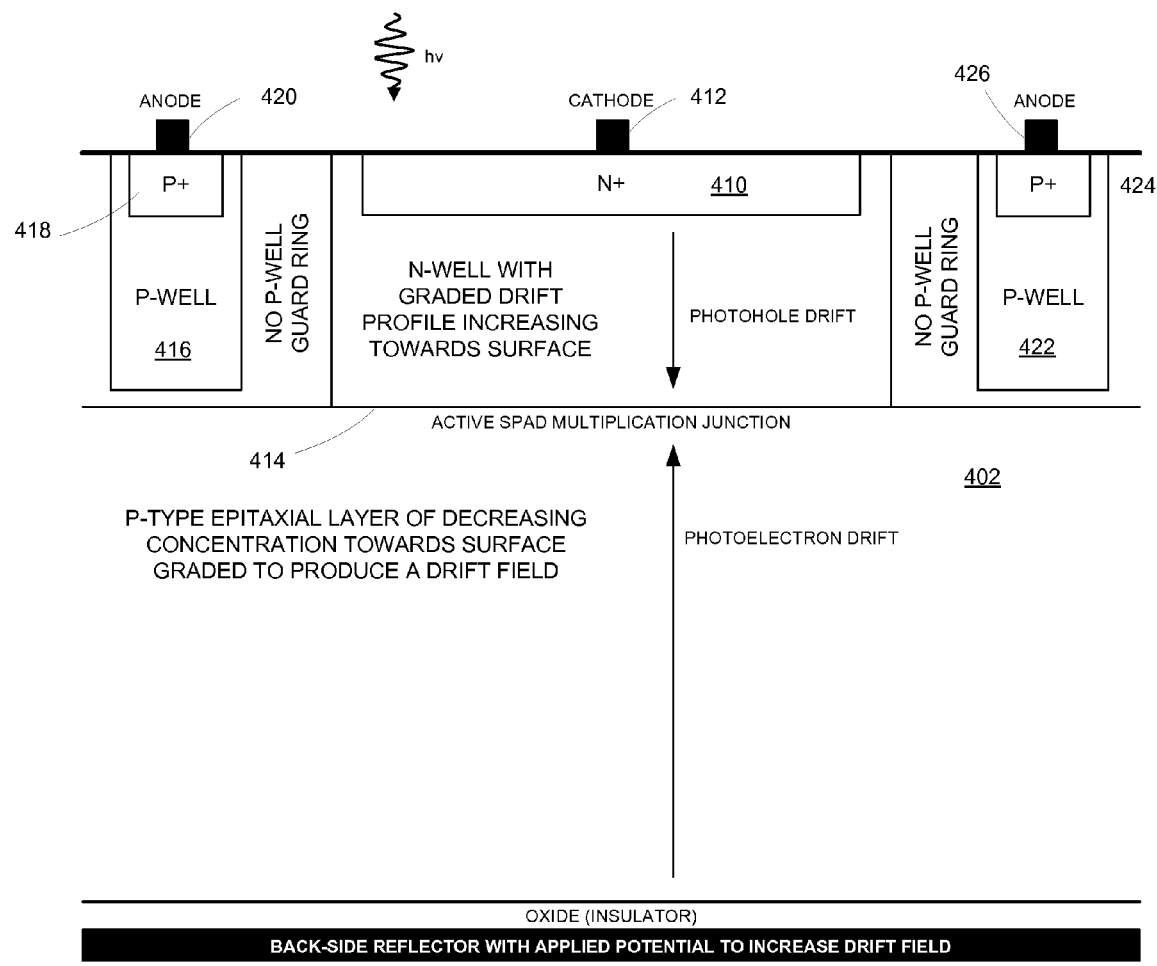
FIG. 20 is a schematic of a variant of the embodiment of FIG. 19, in which the back side metallic reflector is used above an insulating oxide layer.

FIG. 20 is a schematic of a variant of the embodiment of FIG. 19, in which the back side metallic reflector is used above an insulating oxide layer.

In this variant, the additional oxide layer removes the requirement for the metallic reflector to be at the same electrostatic potential as the substrate. A potential can be applied to the metallic layer to increase the drift field in the substrate, improving sensitivity further. Alternatively, a potential could be used to passivate the back surface and to reduce the generation of minority carriers, reducing the noise in a thinned substrate device. This embodiment can retain the reflectivity benefits of the SPAD of FIG. 19.

Figure 21:
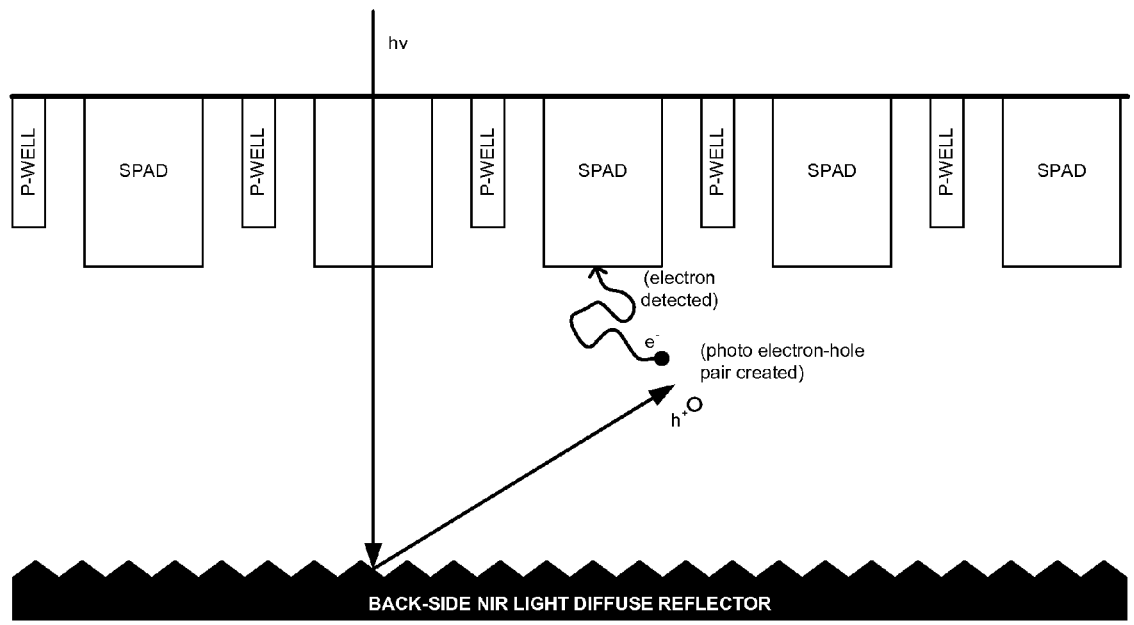
FIG. 21 is a schematic of a further variant of the embodiment of FIG. 19, in which the back-side reflector uses a diffuse reflector instead of a simple reflector as part of an array of SPADs.

FIG. 21 is a schematic of a further variant of the embodiment of FIG. 19, in which the back-side reflector uses a 'diffuse' (non-specular) reflector instead of a simple reflector. In this figure an array of SPADs is shown, connected in a Silicon Photomultiplier (SiPM) type application. In this and in subsequent figures, the transmission path of an incoming photon is indicated by the line hv. The use of a non-specular/diffuse reflector in a thinned substrate can be very beneficial to photon detection and timing at very long wavelength light, for example with 920 nm light having a 40 µm absorption depth. This means that the majority of photoelectrons are generated very far away from the SPAD junction in a simple front side illuminated device. However, with substrate thinning and an appropriate diffuse reflector of the structure illustrated in FIG. 21, the effective absorption depth can be increased. Without a reflector, a long wavelength photon penetrates very deep into the substrate and thus has a low chance of being detected, reducing the Photon Detection Efficiency (PDE) of the SPAD. With a simple reflector as shown in FIGS. 19 and 20, the long wavelength photon is reflected and has a second chance of being absorbed. However, it also may be transmitted back out of the front side of the wafer again and subsequently be lost. With a diffuse reflector, however, the structure of the back reflective layer is designed to reflect the incident photon at a high angle. This increases the effective available absorption length and ensures that the photoelectron can always be created close to a SPAD detection junction. This can reduce the probability of recombination before the photoelectron reaches the SPAD detection junction, and can increase the speed at which it does so as it no longer needs to drift for a long distance through the substrate before being detected. This can improve the detection efficiency and timing jitter of an array of detectors.

The use of a diffuse reflector, as illustrated in FIG. 21, can be beneficial in a Silicon Photomultiplier application of the present device where position sensitivity of photon detection is less important than timing and detection of incident photons. The diffuse reflector can increase the detection efficiency and can reduce the diffusion tail leading to an improved timing response.

A diffuse reflector may not be useful for a 2D imager array where the position detection of photon arrival is important, as in a traditional camera. However, SPADs are generally not used as part of 2D image sensors and are often instead used as photon counting and timing applications where position detection is not important, like in a Silicon photomultiplier. The most important parameters are usually photon detection efficiency, and timing response, and both of these features would be improved for IR light with the diffuse reflector.

Figure 22:
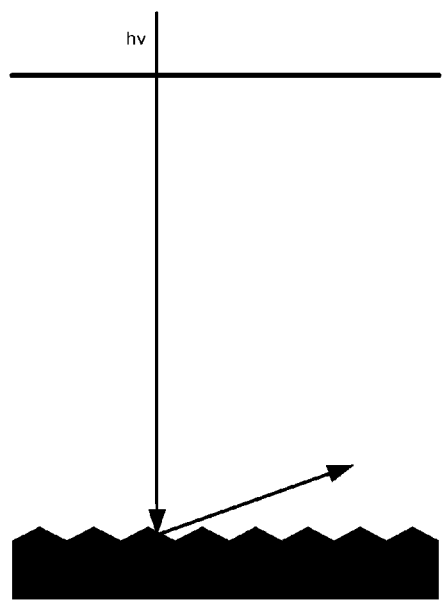
FIG. 22 is a schematic of a first diffuse reflector surface for use with the SPAD of FIG. 21, in which light of normal incidence is reflected at a first angle.

FIG. 22 is a schematic of a first diffuse reflector surface for use with the SPAD of FIG. 21, in which light of normal incidence is reflected at a first angle. This is an example of a preferred arrangement in which light of normal incidence is reflected at an angle that keeps it within the silicon and avoids interference with the other reflector pyramids/grooves.

Figure 23:
FIG. 23 is a schematic of a second diffuse reflector surface for use with the SPAD of FIG. 21, in which light of normal incidence is reflected at a second angle.

FIG. 23 is a schematic of a second diffuse reflector surface for use with the SPAD of FIG. 21, in which light of normal incidence is reflected at a second angle. This is an example of a non-preferred arrangement, having true retro-reflective properties, in which light entering at normal incidence is reflected back along the same path the light entered and subsequently lost from the device.

Figure 24:
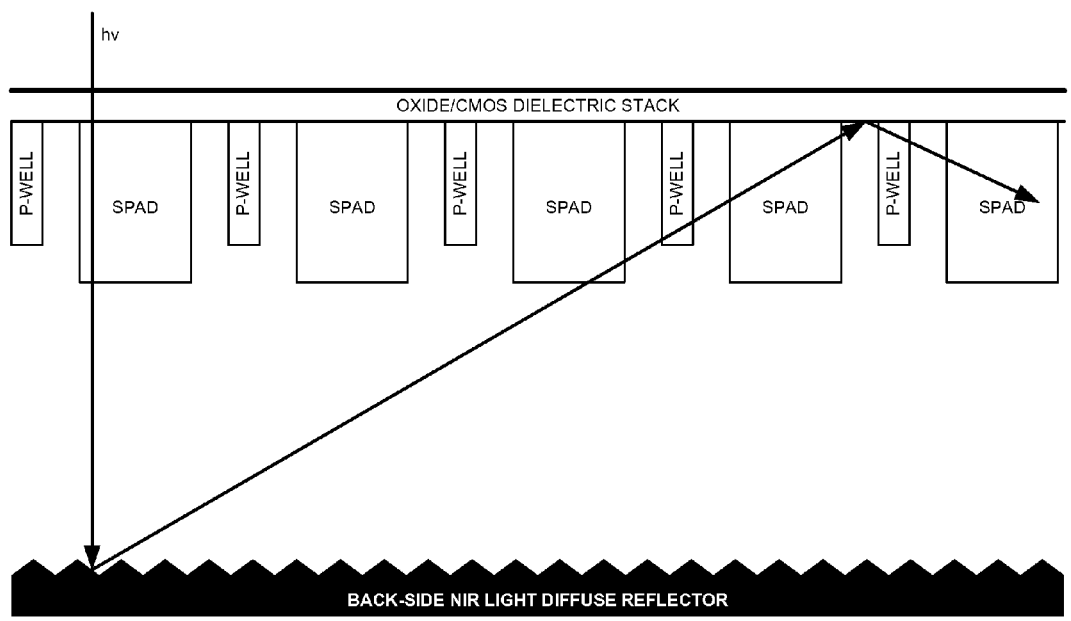
FIG. 24 is a schematic of a third diffuse reflector surface for use with an array of SPADs of FIG. 21, in which light of normal incidence is subject to total internal reflection.

FIG. 24 is a schematic of a third diffuse reflector surface for use with the SPAD of FIG. 21, in which light of normal incidence is subject to total internal reflection. This is an example of a preferred arrangement in which the reflection angle is designed such that total internal reflection occurs at the interface at the boundary between the top silicon surface and the CMOS dielectrics layers. This can prevent the IR light from being transmitted back out of the silicon, increasing detection efficiency.

A first step of fabricating the diffuse reflector as illustrated is to use well established epitaxial growth techniques to achieve the desired doping profile. Then wafer thinning techniques to achieve the desired substrate thickness can be performed. Wafer thinning can use either bulk or Silicon on Insulator (SOI) substrates. For SPADs, keeping the number of process-induced defects to a minimum during this step can be important as they are very sensitive to lattice damage and traps which cause elevated dark count rates. The person skilled in the art will be familiar with the manufacture of such features, for example from S. G. Wuu et al, "A Manufacturable Back-Side Illumination Technology using Bulk-Si Substrate for Advanced CMOS Image Sensor," International Image Sensor Workshop, Bergen, Norway, 2009, E. S. Yang, Microelectronic Devices: McGraw-Hill, Inc., 1988, and R. S. Edelstein et al "Process Integration aspects of back illuminated CMOS Imagers using Smart Stacking technology with best in class direct bonding," International Image Sensor Workshop, Hokkaido, Japan, 2011, the contents of all of which are incorporated herein by virtue of this reference.

The next step is to form the diffuse reflector structure on the back side. This could be achieved in a similar manner to Shallow Trench Isolation (STI) or Deep Trench Isolation (DTI) formation where the width and aspect ratio of the silicon etch can be controlled to achieve the desired reflection angle. Alternatively, etching along a crystal plane can be performed, such as along the <111> direction to make pyramid structures on the back side. Pyramids can be formed by selectively exposing square areas of silicon of the correct size and spacing (according to design constraints described above). Trenches can alternatively be formed by exposing rectangles running the length or breadth of the SPAD array. Next a selective anisotropic wet etch that favours the <111> crystal direction can be performed to create a trench or pyramid with an angled side wall. In the case of etching a standard CMOS (100) substrate along the <111> direction, this produces a fixed pyramid or trench side-wall angle of 54.7° relative to the back surface of the thinned wafer.

Aluminium can then be deposited into the trenches or pyramids created by the silicon etch to form an effective NIR/IR reflector by means of a sputtering process, or similar. Aluminium is regularly deposited as part of standard CMOS metalisation for forming interconnects between devices. An intermediate oxide liner can be grown in the trench. This can also enable a different electrostatic potential to be applied to the diffuse reflector than to the substrate, similar to the SPAD of FIG. 20.

The diffuse reflector described above can also be used with the other two main features of the present embodiment in relation to the planar reflector: applying a potential of 0 Volt to increase the grounding rigidity in the substrate (FIG. 19), and forming an intermediary oxide layer to allow a separate potential to be applied (FIG. 20). Therefore, additional benefits of the pyramid or trench structure may be realised other than its reflective properties. Additional care may have to be taken to passivate the interface states created by the damaging etching step as the total silicon surface area will be increased over a flat surface due to the texturing. Back-side implantation and passivation can therefore be performed as an additional process step to reduce the dark count rate of the devices.

These process steps can be performed prior to front end CMOS and SPAD related implantation and metalisation. For example, first an epitaxial layer with the required doping concentration and gradient to create a drift field can be grown on an bulk starting wafer. Second, the wafer can be thinned down, with or without the use of a handle wafer. Thirdly, the trench/pyramid process steps can be performed, and a new handle wafer applied on top of this. Fourth, the wafer can be flipped and standard CMOS processing and SPAD fabrication can occur on the front side (after removal of the optional front-side handle wafer). A single-mask fabrication technique for the present device can be employed with its associated benefits.

Back Side Illumination is a feature that can be used with CMOS image sensors and CCDs to enhance the light sensitivity of scientific imagers and micron-pitch commercial CMOS image sensors. The major advantage of back-side illumination in these applications is improved fill factor and light sensitivity. Back-side illumination can improve the fill factor and blue spectral response of the present device. For more information see G. Agranov, "Pixel continues to shrink . . . Small pixels for Novel CMOS Image Sensors," International Image Sensor Workshop, Hokkaido, Japan, 2011.

Figure 25:
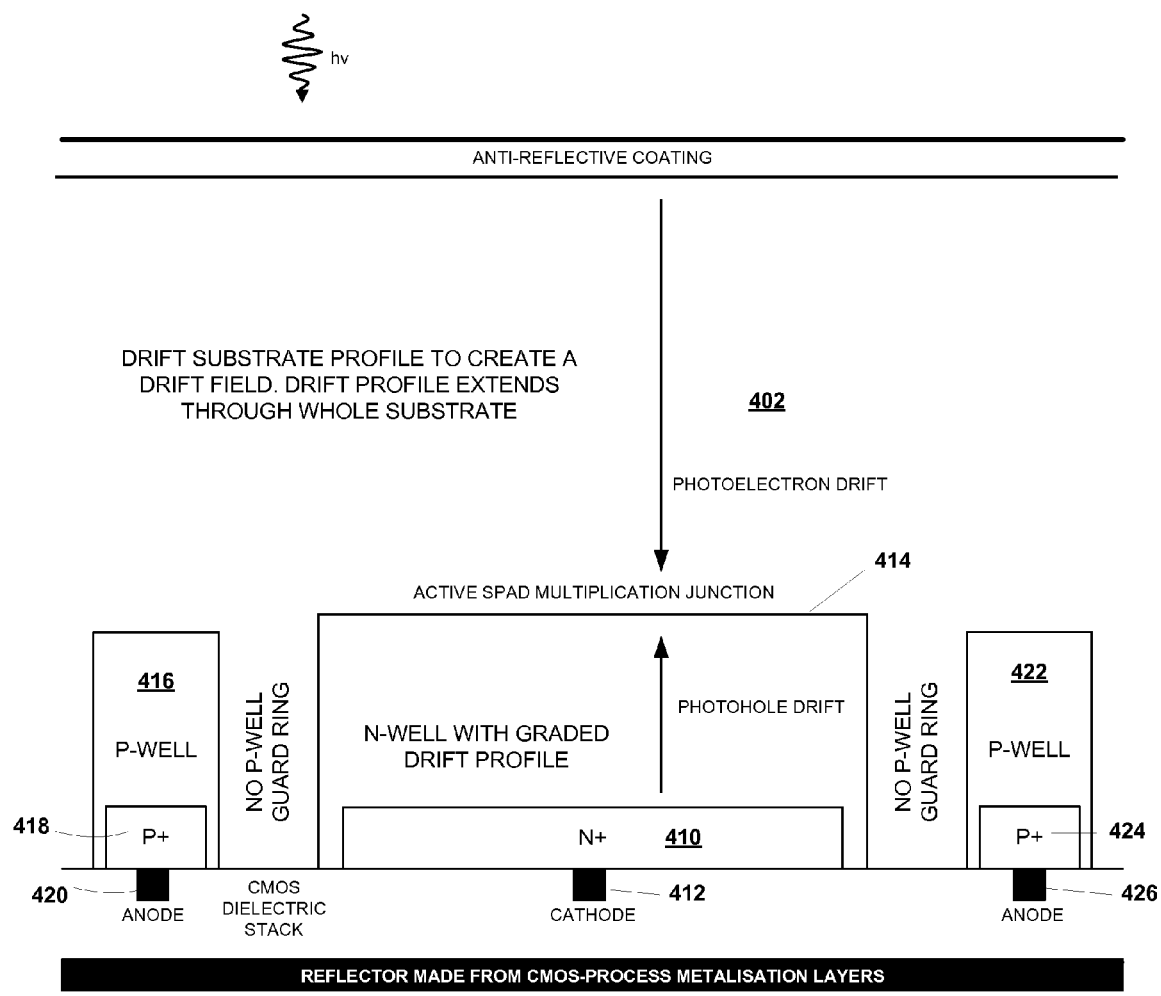
FIG. 25 is a schematic of a back-side illumination (BSI) variant of the embodiment of FIG. 19.

FIG. 25 is a schematic of a back-side illumination (BSI) variant of the embodiment of FIG. 19. This variant uses a front side reflector combined with substrate thinning, a drift profile, and an anti-reflective coating.

In this variant, the substrate thickness can be chosen to tune the spectral response combined with a drift field throughout. One of the advantages of back-side illumination is the ability to define the dielectric layers on top of the silicon because of the removal of the requirement to use the layers dictated by MOSFET fabrication and interconnect metalisation. This means that the dielectric can be made to have anti-reflective (AR) properties by refractive index matching and thin layer effects. The anti-reflective properties can be chosen to be at a maximum specifically for the wavelength of interest, such as 850 nm NIR light. The use of an AR layer increases the external quantum efficiency of the SPAD and improves the proportion of light entering the silicon that can then be subsequently detected.

Additionally, similar to the preceding variants, a reflective layer made from metal can be added to improve the generation rate profile in a thinned back-side illuminated wafer. However, instead of being a customised metal reflector, the standard CMOS metalisation layers on the front side can be repurposed for providing reflective properties as well as being used in routing. This can further improve the optical efficiency by preventing light from being transmitted through the device without being detected.

It will be appreciated that the reflector element of the preceding embodiments may find wider application than SPADs. Long wavelength light detectors made from silicon may benefit, for example. For example, the reflector ideas can be applied to reach-through discrete SPAD structures or Avalanche Photodiodes (APDs). The diffuse reflector in particular can be applied to any array of SPADs or APD structures that exist as an array in CMOS. Alternatively, it could also be used in discrete APDs to improve timing response. In the discrete APD case, a reflector can also be added to the sides of the device to contain the light within.

The diffuse reflector and the simple reflector can be applied to any SPAD structure or array of SPADs implemented in CMOS, for example, providing they exist in the substrate. Such devices may for example include SPADs of the Haitz type, including guard rings of lightly doped n-regions, and documented for example in S. Cova, A. Longoni, A. Andreoni, "Towards picosecond resolution with single-photon avalanche diodes," Review of Scientific Instruments, Vol. 52, No. 3, 1981. Such devices may also, for example, include devices where the guard ring curves in a non-constant sense.

Any position sensitive device that uses NIR light, such as an array of APDs in CMOS for ranging or communication purposes may benefit from the simple reflector. Typically this may probably be limited to 3D time-of-flight imaging and all associated devices like pinned photodiodes and photogates.

A non-position sensitive device such as a large area avalanche photodiode or an array of APDs for photon timing can benefit from incorporating the diffuse reflector feature.

It will be appreciated that the SPAD described herein can be used to form a variety of imaging, communication and scientific devices. The SPAD has been described with reference to standard CMOS fabrication processes but it will be appreciated that the concepts can be applied in other fabrication processes, both standard and custom.

It will furthermore be appreciated that mask alignments can be changed to alter the dopant diffusion characteristics, while still producing a device operating using the same basic principles.

Documents which are cited above are incorporated herein by virtue of this reference.

Further modifications and variations may be made within the scope of the invention herein disclosed.

The invention claimed is:

1. A single photon avalanche diode SPAD, the SPAD comprising:
   a SPAD multiplication junction;
   a first region comprising a first well of a first conductivity type;
   a second region comprising a second well of the first conductivity type formed below and in contact with the first well, the second well having a retrograde doping concentration which increases with depth from the first well toward a bottom of the second well;
   a third region of a second conductivity type, the first and second regions formed within and above the third region, wherein the third region is in contact with sides of the second well and further in contact with the bottom of the second well to provide said SPAD multiplication junction;
   a first contact connected to the first region; and
   a second contact connected to the third region via a conductive pathway of the second conductivity type;
   wherein the third region has a retrograde doping concentration which increases with depth towards the SPAD multiplication junction such that breakdown voltage is smaller at the SPAD multiplication junction at the bottom of the second region than at the sides of the second region.

2. A SPAD according to claim 1, wherein the first and second contacts are arranged on a same surface of a semiconductor substrate.

3. A SPAD according to claim 1, wherein the third region is formed by a semiconductor substrate or an epi-layer of the second conductivity type.

4. A single photon avalanche diode SPAD, the SPAD comprising:
   a SPAD multiplication junction;
   a first region of a first conductivity type arranged on or in a second region comprising an epi-layer or substrate of a second conductivity type;
   wherein a bottom of said first region is in contact with the second region to define said SPAD multiplication junction;
   wherein the first region comprises a first well having a first depth and a second well below the first well having a second depth extending to said bottom and the location of the SPAD multiplication junction;
   a guard ring surrounding and in contact with the first region and formed by a region of the substrate or epi-layer of the second conductivity type;
   a first contact connected to the first region via a conductive pathway of the first conductivity type formed in the first region; and
   a second contact connected to the second region via a conductive pathway of the second conductivity type formed in the epi-layer or substrate;
   wherein the conductive pathway of the second conductivity type comprises a third well having a third depth less than the second depth of the SPAD multiplication junction; and
   wherein the guard ring has a retrograde doping concentration which increases with depth towards the SPAD multiplication junction so that breakdown voltage is smaller at the SPAD multiplication junction between the bottom of the first region and the second region than at sides of the first region in contact with the guard ring.

5. A SPAD according to claim 4, wherein the SPAD is formed substantially within the epi-layer.

6. A SPAD according to claim 4, wherein the first region has a retrograde doping gradient which increases with depth towards the SPAD multiplication junction.

7. A SPAD according to claim 1, further comprising a guard ring formed by the substrate region at said sides of the second region.

8. A SPAD according to claim 1, further comprising a guard ring formed by a portion of the third region having the retrograde doping concentration.

9. A SPAD according to claim 4, wherein a doping concentration of the second well increases with depth.

10. A SPAD according to claim 1, wherein a depth of the SPAD multiplication junction is below a bottom of the conductive pathway.

11. A SPAD according to claim 1, wherein the SPAD multiplication junction extends substantially parallel to an upper surface of the first region.

12. A SPAD according to claim 1, further comprising an inner well of the second conductivity type formed within the first region and laterally isolated from the first region by a guard ring surrounding the inner well.

13. A SPAD according to claim 1, wherein the depth of the SPAD multiplication junction is 2 μm.

14. A SPAD according to claim 4, wherein a depth of the SPAD multiplication junction is 2 μm.

15. A single photon avalanche diode SPAD, the SPAD comprising:
   a first region comprising a first well of a first conductivity type;
   a second region comprising a second well of the first conductivity type formed below the first well;
   a third region of a second conductivity type, the first and second regions formed within and above the third region;
   an enhancement implant of the second conductivity type formed within the third region below the second well and in contact with a bottom of the second well at a SPAD multiplication junction;
   a first contact connected to the first region; and
   a second contact connected to the third region via a conductive pathway of the second conductivity type;
   wherein the doping in the vicinity of the second region is controlled such that the breakdown voltage is smaller at the SPAD multiplication junction than at sides of the second region, and wherein SPAD multiplication occurs at the SPAD multiplication junction when an appropriate bias voltage is applied between the first and second contacts.

16. The SPAD of claim 15, wherein the third region has a retrograde doping concentration which increases with depth towards the SPAD multiplication junction.

17. The SPAD of claim 16, further comprising a guard ring formed by a portion of the third region having the retrograde doping concentration.

18. The SPAD of claim 15, wherein the second well has a retrograde doping concentration which increases with depth from the first well toward the bottom of the second well.

19. The SPAD of claim 15, wherein the first and second contacts are arranged on a same surface of a semiconductor substrate.

20. The SPAD of claim 15, wherein the third region is formed by a semiconductor substrate or an epi-layer.

21. The SPAD of claim 20, wherein the SPAD is formed substantially within the epi-layer.

22. The SPAD of claim 15, further comprising a guard ring formed by the third region at said sides of the second region.

23. The SPAD of claim 15, wherein a depth of the SPAD multiplication junction is greater than a deepest part of the conductive pathway.

24. The SPAD of claim 15, wherein the SPAD multiplication junction is substantially parallel to a surface of a semiconductor substrate within which the SPAD is integrated.

25. The SPAD of claim 15, wherein the depth of the SPAD multiplication junction is 2 µm.

26. A single photon avalanche diode SPAD, the SPAD comprising:
a SPAD multiplication junction;
a first well of a first conductivity type;
a substrate region of a second conductivity type, the first well located within the substrate region, wherein the substrate region is in contact with a bottom of the first well to provide said SPAD multiplication junction;
a guard ring surrounding an upper portion of the first well, wherein a depth of the bottom of the second well at the SPAD multiplication junction is lower than a lowest part of the guard ring and wherein the guard ring is formed by a region of the first conductivity type which is more lightly doped that the first well;
a first contact connected to the first region; and
a second contact connected to the third region via a conductive pathway of the second conductivity type.

27. The SPAD of claim 26, wherein the guard ring is formed by a region of the second conductivity type which more lightly doped than the substrate region.

28. The SPAD of claim 26, wherein the guard ring is formed by a region of insulating material.

29. The SPAD of claim 26, wherein the first well has a retrograde doping concentration which increases with depth toward the bottom of the first well at the SPAD multiplication junction.

30. The SPAD of claim 26, wherein the depth of the bottom of the second well at the SPAD multiplication junction is below a bottom of the conductive pathway.

31. The SPAD of claim 26, wherein the depth of the bottom of the second well at the SPAD multiplication junction is 2 µm.

32. The SPAD of claim 26, wherein the substrate region is formed by a semiconductor substrate or an epi-layer.

* * * * *